(12) United States Patent
Shimada et al.

(10) Patent No.: US 8,810,038 B2
(45) Date of Patent: Aug. 19, 2014

(54) SEMICONDUCTOR DEVICE AND WIRING BOARD

(75) Inventors: Takafumi Shimada, Yokohama (JP); Atsushi Kikuchi, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 36 days.

(21) Appl. No.: 13/305,679

(22) Filed: Nov. 28, 2011

(65) Prior Publication Data
US 2012/0187581 A1 Jul. 26, 2012

(30) Foreign Application Priority Data
Jan. 24, 2011 (JP) ................................. 2011-012022

(51) Int. Cl.
| | |
|---|---|
| H01L 29/40 | (2006.01) |
| H05K 1/02 | (2006.01) |
| H01L 23/66 | (2006.01) |
| H01L 23/64 | (2006.01) |
| H01L 23/00 | (2006.01) |
| H01L 23/538 | (2006.01) |
| H01L 23/50 | (2006.01) |
| H01L 25/065 | (2006.01) |
| H01L 25/16 | (2006.01) |

(52) U.S. Cl.
CPC ......... *H01L 24/49* (2013.01); *H01L 2924/3011* (2013.01); *H01L 2924/01033* (2013.01); *H01L 2224/16225* (2013.01); *H05K 1/024* (2013.01); *H01L 2224/49175* (2013.01); *H05K 1/0218* (2013.01); *H01L 24/48* (2013.01); *H01L 2924/01005* (2013.01); *H01L 2924/15311* (2013.01); *H01L 2924/01023* (2013.01); *A01L 2924/01006* (2013.01); *H01L 2924/01019* (2013.01); *H01L 2924/19107* (2013.01); *H01L 2924/01078* (2013.01); *H01L 2924/19041* (2013.01); *H01L 2224/4911* (2013.01); *H04L 2224/48227* (2013.01); *H01L 23/5383* (2013.01); *H01L 2924/01029* (2013.01); *H01L 2924/01079* (2013.01); *H01L 23/66* (2013.01); *H01L 2223/6638* (2013.01); *H05K 2201/0715* (2013.01); *H01L 2924/01047* (2013.01); *H01L 2924/19043* (2013.01); *H01L 23/50* (2013.01); *H01L 25/0655* (2013.01); *H01L 23/642* (2013.01); *H01L 2924/014* (2013.01); *H01L 2224/48091* (2013.01); *H01L 2924/01074* (2013.01); *H01L 25/16* (2013.01); *H01L 2924/19105* (2013.01); *H01L 2224/48465* (2013.01); *H01L 2223/6666* (2013.01); *H05K 2201/0191* (2013.01)
USPC .............. 257/774; 257/E23.174; 257/E21.24; 438/312; 438/761

(58) Field of Classification Search
USPC .............................. 257/784, E23.01; 174/260
See application file for complete search history.

(56) References Cited

U.S. PATENT DOCUMENTS

| | | | |
|---|---|---|---|
| 2005/0205516 A1* | 9/2005 | Sugimoto et al. ................ 216/13 |
| 2006/0137905 A1* | 6/2006 | Kariya et al. ................. 174/255 |
| 2010/0139968 A1* | 6/2010 | Takenaka et al. ............. 174/263 |

FOREIGN PATENT DOCUMENTS

| | | |
|---|---|---|
| JP | 3-223371 A | 10/1991 |
| JP | 2005-191142 A | 7/2005 |

* cited by examiner

Primary Examiner — Elias M Ullah
(74) Attorney, Agent, or Firm — Fujitsu Patent Center

(57) ABSTRACT

A semiconductor device includes: a board; a power wire formed on the board; a signal wire formed on the board; a ground wire formed on the board; an insulating layer covering the signal wire, the power wire and the ground wire; and a metal film formed on the insulating layer, wherein a thickness of the insulating layer covering the power wire is different from a thickness of the insulating layer covering the signal wire, and the metal film is connected to a ground potential.

15 Claims, 26 Drawing Sheets

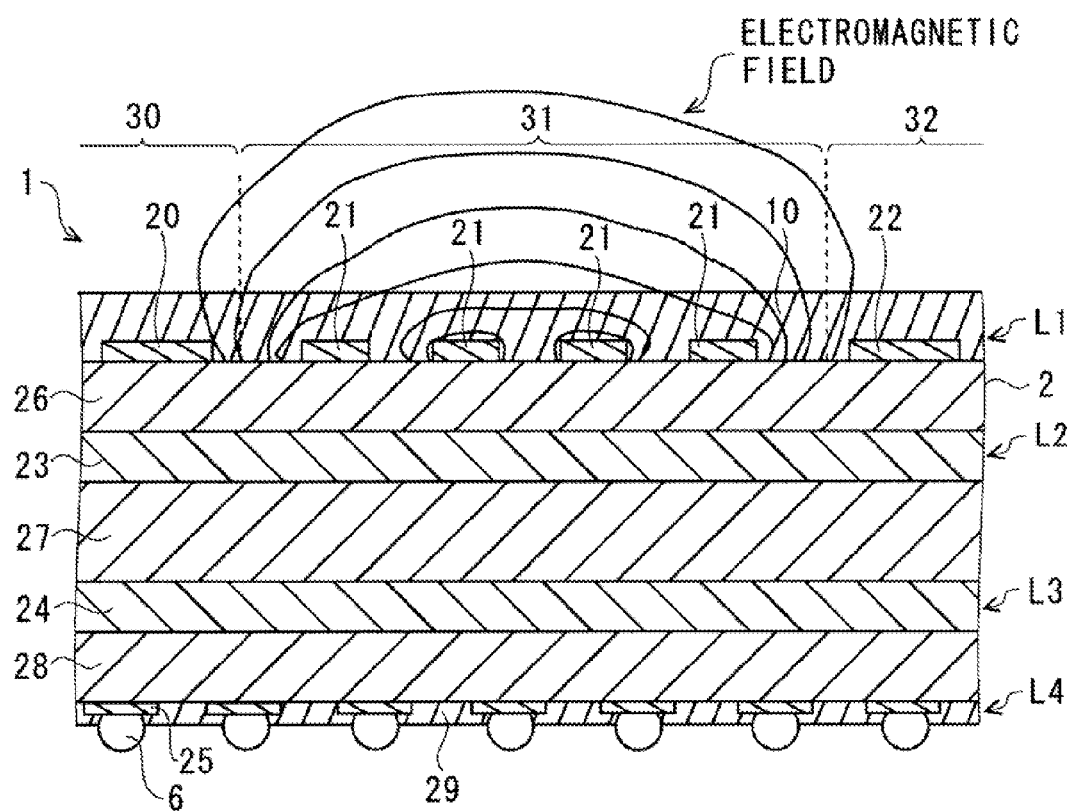

| THICKNESS (μm) OF SOLDER RESIST 10 ON SIGNAL WIRE 21 | CHARACTERISTIC IMPEDANCE (Ω) OF SIGNAL WIRE 21 |
|---|---|
| 25 | 42.25 |
| 30 | 45.49 |
| 35 | 48.22 |
| 38 | 49.67 |
| 39 | 50.12 |
| 40 | 50.54 |
| 45 | 52.53 |
| 50 | 54.27 |

| THICKNESS (μm) OF SOLDER RESIST 10 ON POWER PLANE 20 (METAL FILM 11 NOT PROVIDED) | CAPACITANCE (pF) OF POWER PLANE 20 |
|---|---|
| 15 | 10.97 |
| 20 | 11.03 |
| 25 | 11.03 |
| 30 | 10.85 |
| 35 | 11.03 |
| 40 | 11.03 |

| THICKNESS (μm) OF SOLDER RESIST 10 ON POWER PLANE 20 (METAL FILM 11 PROVIDED) | CAPACITANCE (pF) OF POWER PLANE 20 |
|---|---|
| 15 | 68.53 |
| 20 | 53.64 |
| 25 | 45.48 |
| 30 | 38.55 |
| 35 | 35.62 |
| 40 | 32.19 |

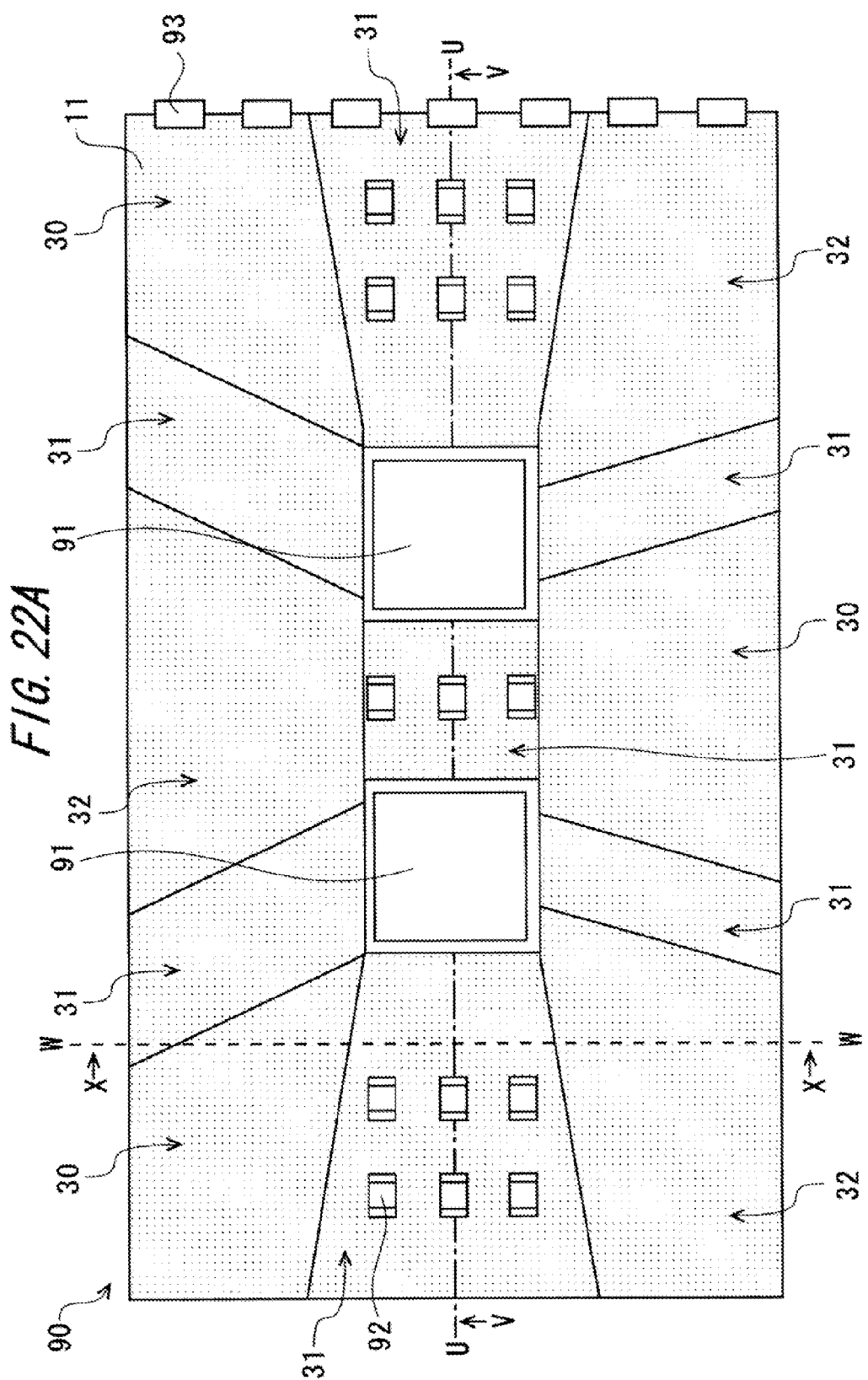

SEMICONDUCTOR DEVICE AND WIRING BOARD

CROSS-REFERENCE TO RELATED APPLICATION

This application is based upon and claims the benefit of priority of the prior Japanese Patent Application No. 2011-012022, filed on Jan. 24, 2011, the entire contents of which are incorporated herein by reference.

FIELD

The embodiment discussed herein is related to a semiconductor device and a wiring board.

BACKGROUND

It is of importance to perform impedance matching between input and output impedance of a semiconductor element and characteristic impedance of a signal wire on a wiring board. If the impedance matching is not sufficiently conducted, an electric signal transmitted through the signal wire is reflected, and a waveform of the signal is disturbed, which leads to a malfunction of a semiconductor element. It is therefore desired to carry out the impedance matching between the input and output impedance of the semiconductor element and the characteristic impedance of the signal wire. Further, a so-called decoupling capacitor is disposed in the vicinity of the semiconductor element in order to supply the power to the semiconductor element and to restrain noises of the power supply, thereby stabilizing an electric potential of the power supply (which will hereinafter be referred to as a power potential or a supply voltage) and a ground potential for the semiconductor element.

[Patent document 1] Japanese Laid-open Patent Publication No. 03-223371

[Patent document 2] Japanese Laid-open Patent Publication No. 2005-191142

SUMMARY

According to an aspect of the embodiment, a semiconductor device includes: a board; a power wire formed on the board; a signal wire formed on the board; a ground wire formed on the board; an insulating layer covering the signal wire, the power wire and the ground wire; and a metal film formed on the insulating layer, wherein a thickness of the insulating layer covering the power wire is different from a thickness of the insulating layer covering the signal wire, and the metal film is connected to a ground potential.

The object and advantages of the embodiment will be realized and attained by means of the elements and combinations particularly pointed out in the claims. It is to be understood that both the foregoing general description and the following detailed description are exemplary and explanatory and are not restrictive of the embodiment, as claimed.

BRIEF DESCRIPTION OF THE DRAWINGS

FIG. 5B is a sectional view of the main components of the semiconductor device 1 taken along the dotted line C-C in FIG. 5A as viewed in the arrow direction D.

FIG. 22A is a top view of the wiring board 90 according to the fourth working example.

DESCRIPTION OF EMBODIMENT

A semiconductor device and a wiring board according to an embodiment will hereinafter be described with reference to the drawings in a way that exemplifies working examples. Configurations in the following working examples are exemplifications, and the embodiment is not limited to the configurations in the working example.

First Working Example

Figure 1A:
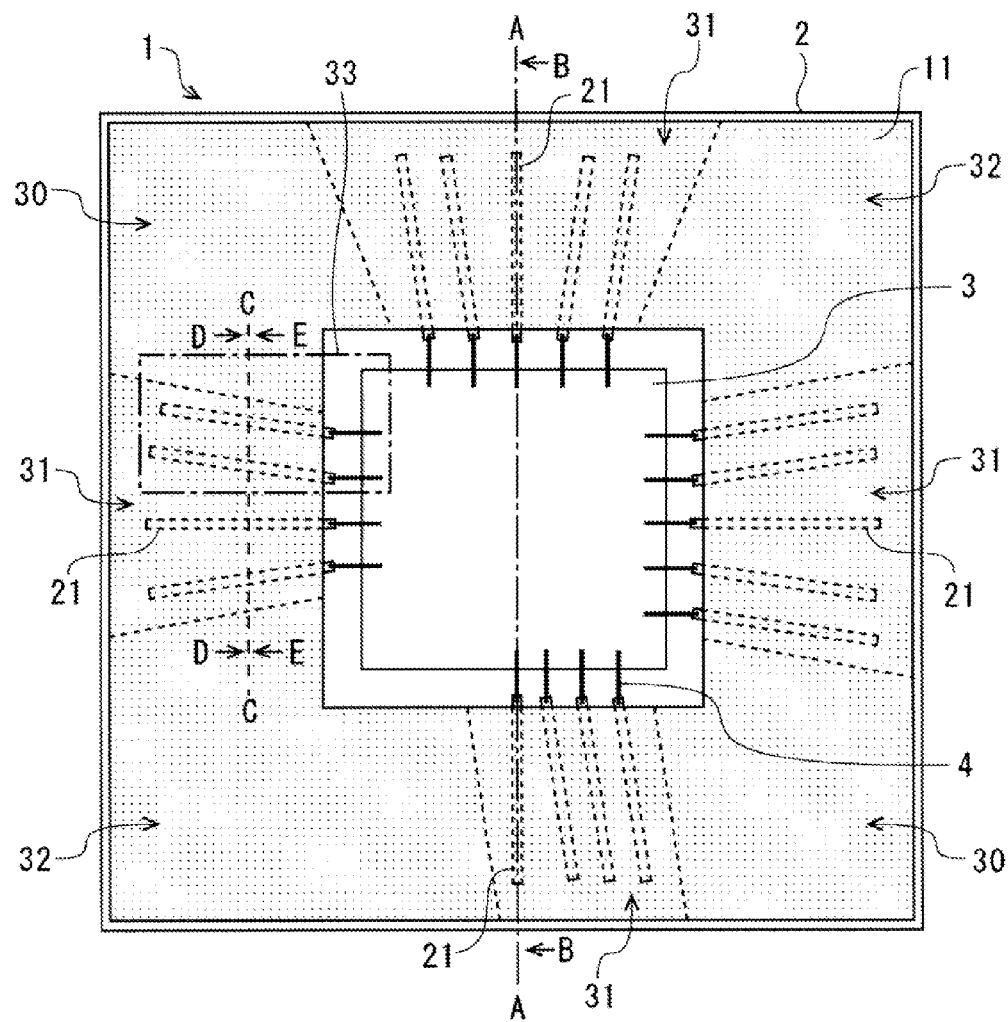
FIG. 1A is a top view of a semiconductor device 1 according to a first working example.
Figure 1B:
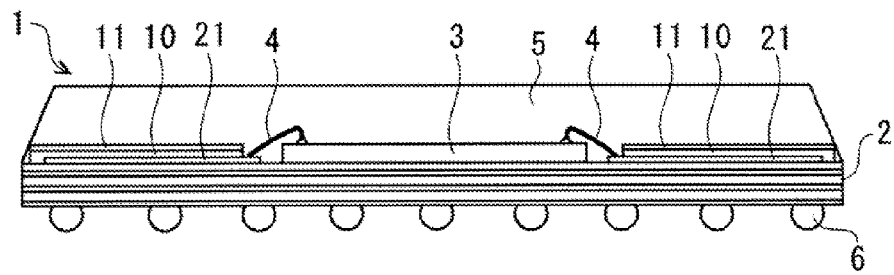
FIG. 1B is a sectional view of the semiconductor device 1 taken along the alternate long and short dash line A-A in FIG. 1A as viewed in the arrow direction B.

FIG. 1A is a top view of a semiconductor device 1 according to a first working example. FIG. 1B is a sectional view of the semiconductor device 1 taken along the alternate long and short dash line A-A in FIG. 1A as viewed in the arrow direction B. The semiconductor device 1 illustrated in FIGS. 1A and 1B includes a semiconductor element 3 such as an LSI (Large Scale Integration) chip mounted on a wiring board 2 like an interposer substrate that is provided on the semiconductor device 1. The wiring board 2 and the semiconductor element 3 are electrically connected to each other via wires 4. The semiconductor element 3 mounted on the wiring board 2 is sealed by a mold resin 5. Note that FIG. 1A omits an illustration of the mold resin 5. On the wiring board 2, a plurality of solder balls 6 is provided on the surface opposite to the surface on which the semiconductor element 3 is disposed. The semiconductor device 1 is connected to another board such as a motherboard via the solder balls 6.

On the wiring board 2, a solder resist 10 is formed so as to surround the semiconductor element 3. A metal film 11 is formed on the solder resist 10. Accordingly, the metal film 11 is formed on the solder resist 10 in a way that surrounds the semiconductor element 3. The solder resist 10 is, e.g., an insulating resin such as an epoxy resin, an acrylic resin and a polyimide resin or a mixed resin thereof. The solder resist 10 may be a photosensitive resin and may also be a thermosetting resin. The solder resist 10 is given by way of one example of an insulating layer. The solder resist 10 may involve using, e.g., a liquid solder resist and may also involve employing a film solder resist. A relative permittivity ($\in$r) of the solder resist 10 is, e.g., 3.9 but, without being limited to this value, may take other values.

In the case of the liquid solder resist 10, the solder resist 10 is coated over the wiring board 2 by, e.g., a screen printing technique using a mask. In the case of the film-shaped solder resist 10, the solder resist 10 is pasted onto the wiring board 2 by employing, e.g., a vacuum laminator.

The metal film 11 is, e.g., copper (Cu), titanium (Ti), nickel (Ni), gold (Au), platinum (Pt) or silver (Ag). For instance, the metal film 11 is formed on the solder resist 10 by vapor deposition or plating. In the case of forming the metal film 11 by the vapor deposition, for instance, the metal film 11 is formed on the solder resist 10 by sputtering which uses a mask. In the case of forming the metal film 11 by plating, for example, the metal film 11 is formed on the solder resist 10 by electroless plating which employs the mask. A thickness of the metal film 11 is, e.g., equal to or larger than 1 μm and equal to or smaller than 5 μm but may, without being limited to these value, take other values. The wiring board 2 includes signal wires 21, and power regions 30, wiring regions 31 and ground regions 32 are demarcated on the wiring board 2. Descriptions of the signal wire 21, the power region 30, the wiring region 31 and the ground region 32 will be made later on.

Figure 2A:
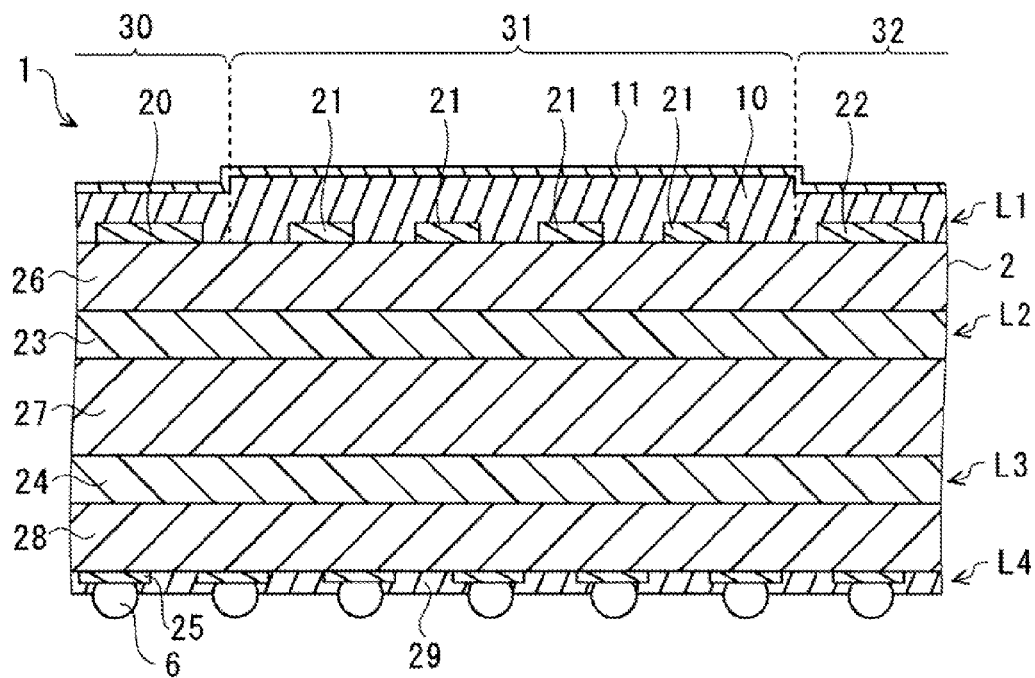
FIG. 2A is a sectional view of main components of the semiconductor device 1 taken along the dotted line C-C in FIG. 1A as viewed in the arrow direction D.
Figure 2B:
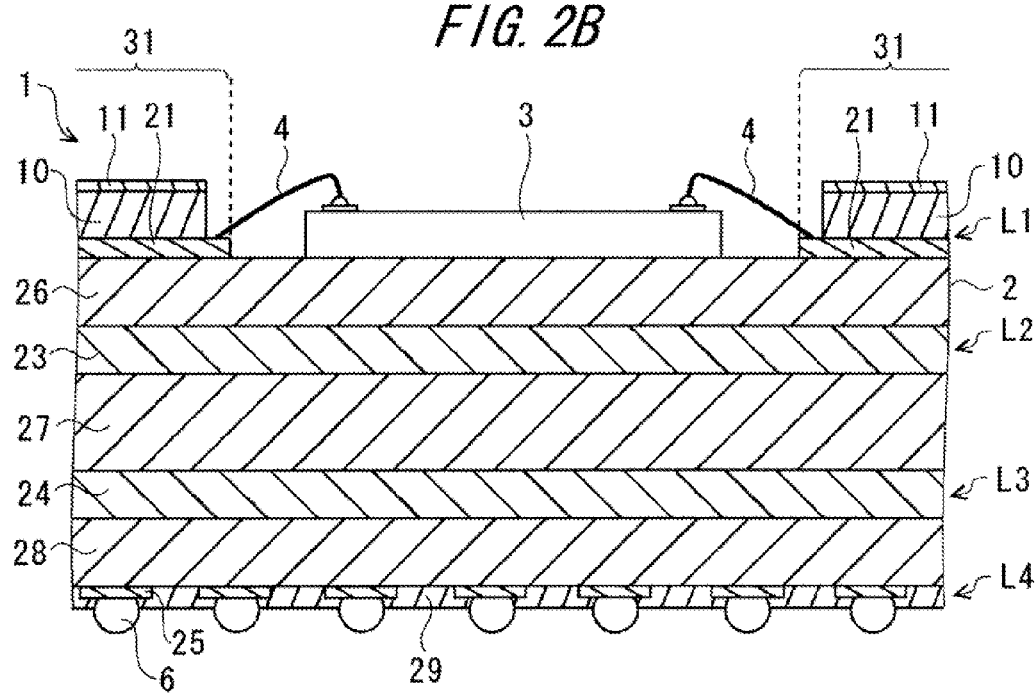
FIG. 2B is a sectional view of the main components of the semiconductor device 1 taken along the alternate long and short dash line A-A in FIG. 1A as viewed in the arrow direction B.

FIG. 2A is a sectional view of main components of the semiconductor device 1 taken along the dotted line C-C in FIG. 1A as viewed in the arrow direction D. FIG. 2B is a sectional view of the main components of the semiconductor device 1 taken along the alternate long and short dash line A-A in FIG. 1A as viewed in the arrow direction B. As illustrated in FIGS. 2A and 2B, the wiring board 2 includes power planes 20, the signal wires 21 and a ground plane 22 in an L1 layer, includes a ground plane 23 in an L2 layer, includes a power plane 24 in an L3 layer, and includes external electrode pads 25 in an L4 layer. As illustrated in FIGS. 2A and 2B, the power plane 20, the signal wires 21 and the ground plane 22 are covered by the solder resist 10. The power planes 20, 24, the signal wires 21, the ground planes 22, 23 and the external electrode pads 25 are composed of metal materials such as copper (Cu). The power plane 20 is given by way of one example of a power wire. The ground plane 22 is given by way of one example of a ground wire. A thickness of each of the power plane 20, the signal wire 21 and the ground plane 22 is, e.g., 10 μm but may, without being limited to this value, take other values. A thickness of each of the ground plane 22 and the power plane 24 is, e.g., 35 μm but may, without being limited to this value, take other values. The external electrode pads 25 are joined to the solder balls 6.

Note that the power plane 20 is connected to a power via (unillustrated), and the power via is connected via the external electrode pad 25 to an electric potential of the power supply (which will hereinafter be simply referred to as the power potential), whereby the power plane 20 is connected to the power potential. The ground plane 22 is connected to a ground via (unillustrated), and the ground via is connected to a ground potential via the external electrode pad 25, whereby the ground plane 22 is connected to the ground potential.

As illustrated in FIGS. 2A and 2B, the wiring board 2 includes a prepreg 26 defined as an insulator (dielectric substance) between the L1 layer and the L2 layer, includes a core 27 defined as an insulator (dielectric substance) between the L2 layer and the L3 layer, and includes a prepreg 28 defined as an insulator (dielectric substance) between the L3 layer and the L4 layer. A thickness of each of the prepregs 26 and 28 is, e.g., 100 μm but may, without being limited to this value, take other values. A thickness of the core 27 is, e.g., 200 μm but may, without being limited to this value, take other values. The relative permittivity (∈r) of each of the prepreg 26, the core 27 and the prepreg 28 is, e.g., 4.9 but may, without being limited to this value, take other values. Further, on the wiring board 2, a solder resist 29 is formed on the surface opposite to the surface on which the semiconductor element 3 is disposed. A material of the solder resist 29 and a forming method thereof are the same as those of the solder resist 10.

As illustrated in FIG. 2A, the semiconductor device 1 contains such a region that the prepreg 26 is interposed between the power plane 20 and the ground plane 23. Accordingly, the power plane 20, the ground plane 23 and the prepreg 26 interposed between the power plane 20 and the ground plane 23 buildup a function as a decoupling capacitor in the semiconductor device 1. Namely, the decoupling capacitor is formed under the power region 30 of the semiconductor device 1. The decoupling capacitor is formed under the power region 30 of the semiconductor device 1, thereby enabling noises such as simultaneous switching noises to be reduced in the semiconductor device 1.

As illustrated in FIG. 2A, the solder resist 10 is formed on the wiring board 2 in a manner that covers the power plane 20, the signal wires 21 and the ground plane 22. In the embodiment, on the wiring board 2, a region formed with the power plane 20 is demarcated as the power region 30, a region formed with the signal wires 21 is demarcated as a wire region 31, and a region formed with the ground plane 22 is demarcated as a ground region 32. A boundary between the power region 30 and the wire region 31 may be any set. Further, a boundary between the wire region 31 and the ground region 32 may be also any set. A thickness of the solder resist 10 formed in the power region 30 and the ground region 32 is, e.g., 25 μm. When the thickness of each of the power plane 20 and the ground plane 22 is set to 10 μm, the solder resist 10 formed on the power plane 20 and on the ground plane 22 comes to have the thickness of 15 μm. The thickness of the solder resist 10 formed in the wire region 31 is, e.g., 35 μm. When the thickness of the signal wire 21 is set to 10 μm, the thickness of the solder resist 10 formed on the signal wires 21 is 25 μm.

As illustrated in FIG. 2B, the signal wires 21 exposed from the solder resist 10 are connected to the semiconductor element 3 via the wires 4. The thickness of the solder resist 10 formed in the wire region 31 is, e.g., 35 μm. The thickness of each of the signal wires 21 is set to 10 μm, in which case the thickness of the solder resist 10 formed on the signal wires 21 becomes 25 μm.

In the semiconductor device 1 illustrated in FIGS. 2A and 2B, the formation of the solder resist 10 on the wiring board 2 involves using the liquid solder resist 10. In the case of using the liquid solder resist 10, the solder resist 10 having a fixed thickness may be formed over along the power region 30, the wire region 31 and the ground region 32. In the case of using the liquid solder resist 10, the thickness of the solder resist 10 may be differentiated by changing a coating count of the solder resist 10 on the basis of the power region 30, the ground region 32 and the wire region 31, individually. In FIGS. 2A and 2B, the solder resist 10 in the wire region 31 is formed thicker than the solder resist 10 in the power region 30 and the ground region 32.

Figure 3A:
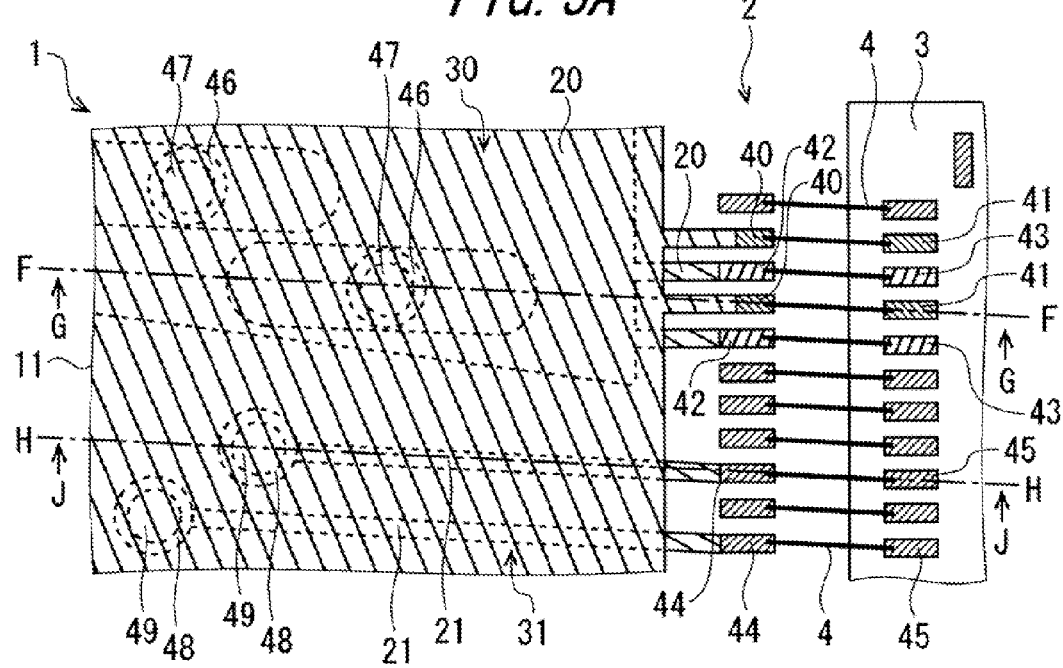
FIG. 3A is an enlarged view of a region 33 depicted by the alternate long and short dash line in FIG. 1A.
Figure 3B:
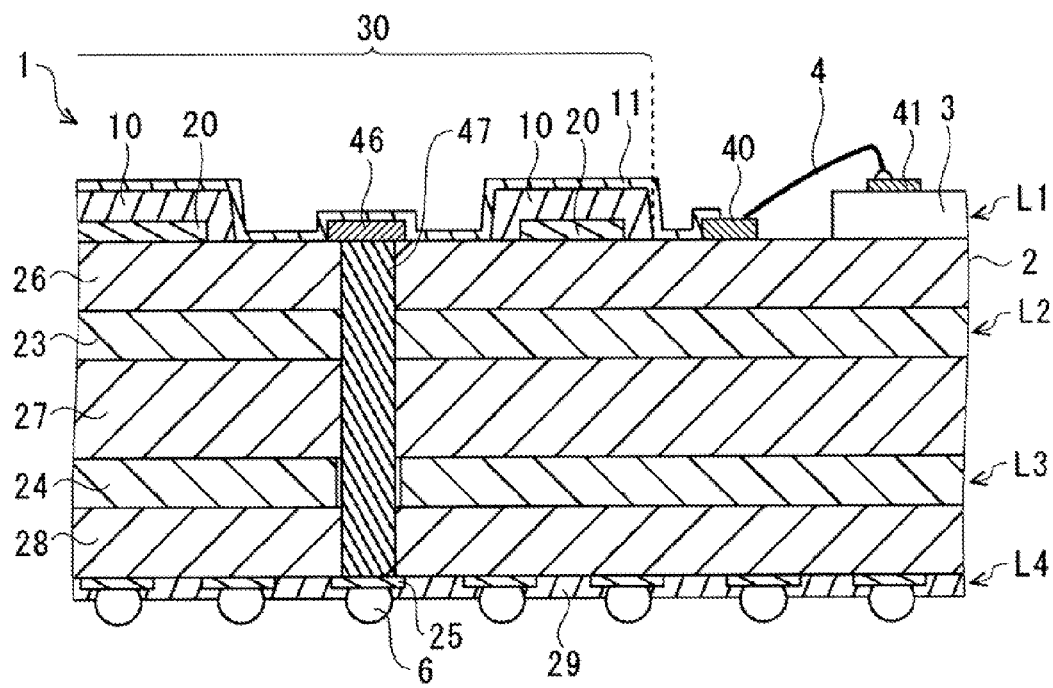
FIG. 3B is a sectional view of the semiconductor device 1 taken along the dotted line F-F in FIG. 3A as viewed in the arrow direction G.
Figure 3C:
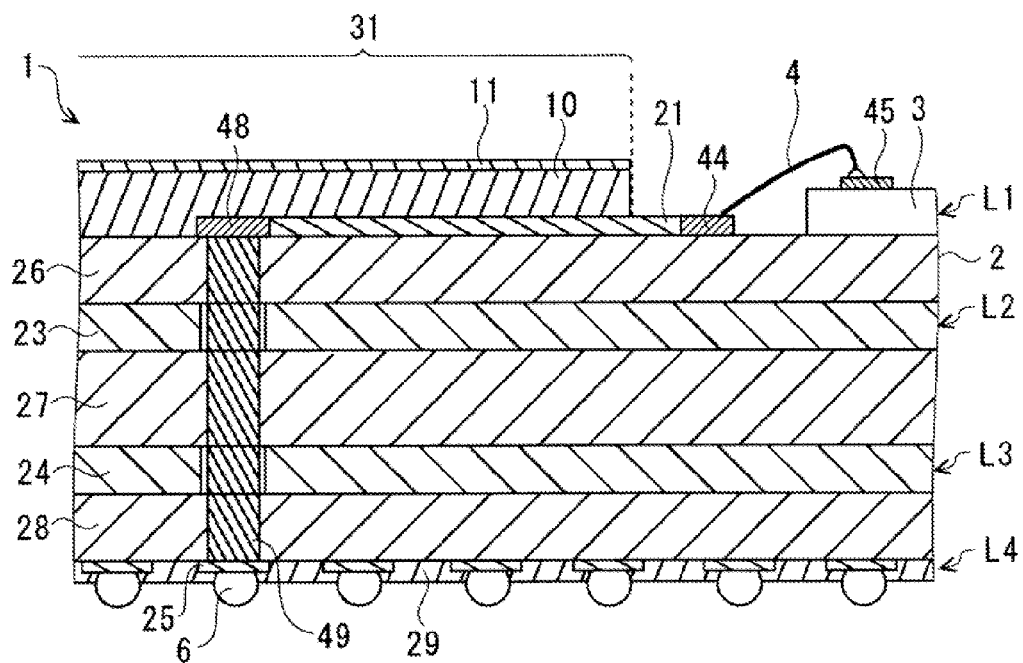
FIG. 3C is a sectional view of the semiconductor device 1 taken along the dotted line H-H in FIG. 3A as viewed in the arrow direction J.

FIG. 3A is an enlarged view of a region 33 depicted by the alternate long and short dash line in FIG. 1A. FIG. 3B is a sectional view of the semiconductor device 1 taken along the dotted line F-F in FIG. 3A as viewed in the arrow direction G. FIG. 3C is a sectional view of the semiconductor device 1 taken along the dotted line H-H in FIG. 3A as viewed in the arrow direction J.

As illustrated in FIG. 3A, ground pads 40, power pads 42 and bonding pads 44 are provided on the wiring board 2. As illustrated in FIGS. 3A and 3B, the metal film 11 is connected to the ground pads 40 provided on the wiring board 2. The metal film 11 is formed in a way that takes a partially-protruded shape, and this protruded portion of the metal film 11 is connected to the ground pads 40 provided on the wiring board 2. As depicted in FIGS. 3A and 3B, the ground pads 40 provided on the wiring board 2 are connected via the wires 4 to ground pads 41 provided on the semiconductor element 3. As illustrated in FIG. 3A, the power plane 20 is formed in a manner that takes a partially-protruded shape, and this protruded portion of the power plane 20 is connected to the power pads 42 provided on the wiring board 2. As illustrated in FIG. 3A, the power pads 42 provided on the wiring board 2 are connected via the wires 4 to power pads 43 provided on the semiconductor element 3. As illustrated in FIGS. 3A and 3C, the bonding pads 44 provided on the wiring board 2 are connected via the wires 4 to bonding pads 45 provided on the semiconductor element 3.

As depicted in FIG. 3B, ground via pads 46 provided on the wiring board 2 are connected to ground vias 47 which penetrate the wiring board 2. The ground vias 47 are connected to the ground plane 23. Further, as illustrated in FIG. 3B, the ground via pads 46 are connected to the metal film 11. The ground vias 47 are connected to the ground potential via the external electrode pad 25, whereby the metal film 11 connects with the ground potential. The thickness of the solder resist 10 formed on the power plane 20 is, e.g., 15 μm.

In the semiconductor device 1 according to the first working example, the solder resist 10 contains such a region that the solder resist 10 is interposed between the metal film 11 connected to the ground potential and the power plane 20. Accordingly, the metal film 11 connected to the ground potential, the power plane 20 and the solder resist 10 interposed between the metal film 11 connected to the ground potential and the power plane 20, buildup the function as the decoupling capacitor in the semiconductor device 1. Namely, the decoupling capacitor is formed in the power region 30 of the semiconductor device 1. The decoupling capacitor is formed in the power region 30 of the semiconductor device 1, thereby enabling the noises such as the simultaneous switching noises to be reduced in the semiconductor device 1.

As illustrated in FIG. 3C, a signal via land 48 provided on the wiring board 2 is connected to a signal via 49 which penetrates the wiring board 2. The thickness of the solder resist 10 formed on the signal wires 21 is, e.g., 25 μm.

(Example in the Case of Using Film-Shaped Solder Resist 10>

Figure 4:
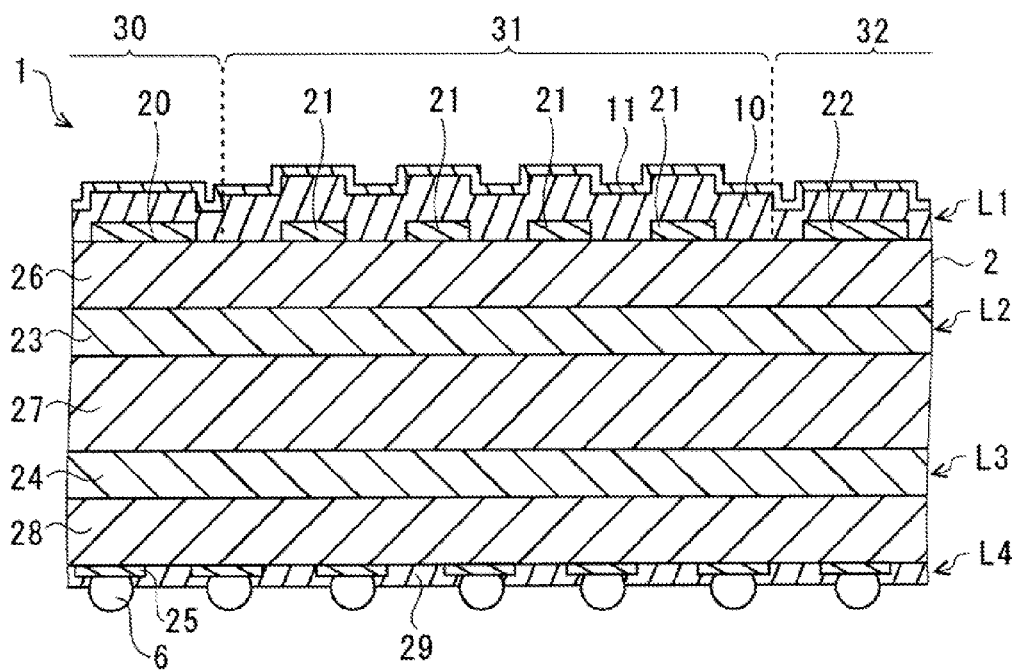
FIG. 4 is a sectional view of the main components of the semiconductor device 1 taken along the dotted line C-C in FIG. 1A as viewed in the arrow direction D.

The semiconductor device 1 will be described with reference to FIG. 4 in the case of forming the solder resist 10 on the wiring board 2 by employing the film-shaped solder resist 10. FIG. 4 is a sectional view of the main components of the semiconductor device 1 taken along the dotted line C-C in FIG. 1A as viewed in the arrow direction D. In the semiconductor device 1 illustrated in FIG. 4, the formation of the solder resist 10 on the wiring board 2 involves using the film-shaped solder resist 10. In the case of using the film-shaped solder resist 10, the solder resist 10 is easy to be affected by a shape of the signal wires 21. Therefore, as depicted in FIG. 4, the solder resist 10 takes a tongued and grooved shape conforming to the shape of the signal wires 21. In the case of using the film-shaped solder resist 10, the thickness of the solder resist 10 may be differentiated by changing a number of how many sheets of solder resists 10 are stacked in the power region 30, the ground region 32 and the wire region 31, individually. In FIG. 4, the solder resist 10 in the wire region 31 is formed thicker than the solder resist 10 in the power region 30 and the ground region 32.

<Simulation of Electromagnetic Field>

A simulation of an electromagnetic field will hereinafter be described with reference to FIGS. 5A, 5B and 6. A case of performing the simulation of the electromagnetic field with respect to the semiconductor device 1 on which the metal film 11 is not formed on the solder resist 10, will be explained with reference to FIGS. 5A and 5B. Further, a case of performing the simulation of the electromagnetic field with respect to the semiconductor device 1 on which the metal film 11 is formed on the solder resist 10, will be described with reference to FIG. 6.

Figure 5A:
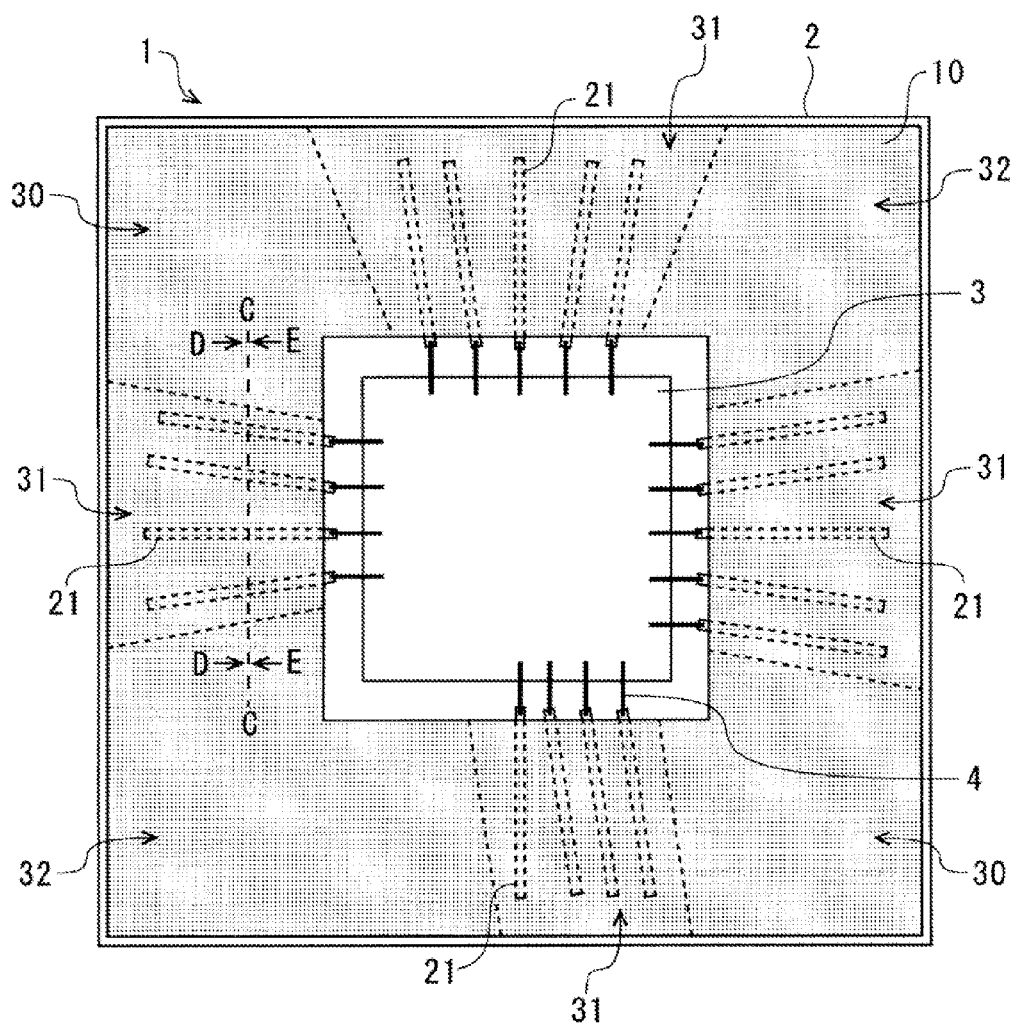
FIG. 5A is a top view of the semiconductor device 1 on which a metal film 11 is not formed on a solder resist 10.

FIG. 5A is a top view of the semiconductor device 1 on which the metal film 11 is not formed on the solder resist 10. FIG. 5B is a sectional view of the main components of the semiconductor device 1 taken along the dotted line C-C in FIG. 5A as viewed in the arrow direction D in the case of performing the simulation of the electromagnetic field with respect to the semiconductor device 1 on which the metal film 11 is not formed on the solder resist 10. In the semiconductor device 1 illustrated in FIG. 5B, a width of each the signal wires 21 is set to 40 μm, and a distance between the two neighboring signal wires 21 is set to 40 μm. The thickness of the solder resist 10 on the power plane 20, the signal wires 21 and the ground plane 22 is 25 μm.

Figure 6:
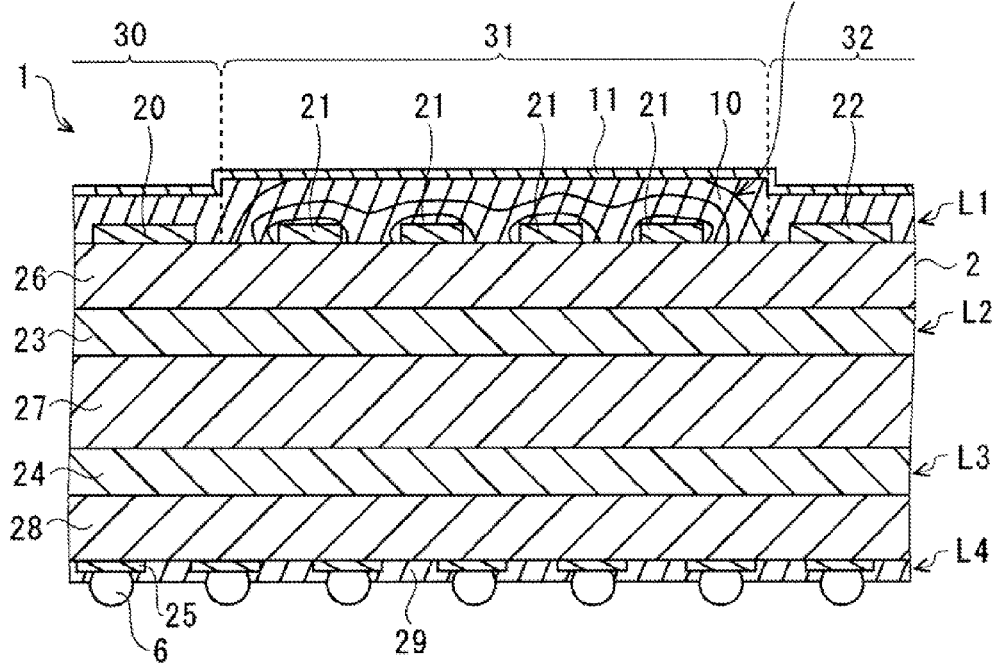
FIG. 6 is a sectional view of the main components of the semiconductor device 1 taken along the dotted line C-C in FIG. 1A as viewed in the arrow direction D.

FIG. 6 is a sectional view of the main components of the semiconductor device 1 taken along the dotted line C-C in FIG. 1A as viewed in the arrow direction D in the case of performing the simulation of the electromagnetic field with respect to the semiconductor device 1 on which the metal film 11 is formed on the solder resist 10. In the semiconductor device 1 illustrated in FIG. 6, the width of each the signal wires 21 is set to 40 μm, and the distance between the two adjacent signal wires 21 is set to 40 μm. The thickness of the solder resist 10 on the power plane 20 and the ground plane 22 is 15 μm. The thickness of the solder resist 10 on the signal wires 21 is 25 μm.

In the semiconductor device 1 depicted in FIG. 6, the metal film 11 is formed on the solder resist 10, and hence electromagnetic-field-like coupling occurs between the metal film 11 and the signal wires 21, in which the electromagnetic-field-like coupling in the two neighboring signal wires 21 is reduced. While on the other hand, in the semiconductor device 1 illustrated in FIG. 5B, the metal film 11 is not formed on the solder resist 10, and therefore the electromagnetic-field-like coupling in the two neighboring signal wires 21 is not reduced.

<Calculation of Characteristic Impedance of Signal Wire 21 (Single End Wire)>

The metal film 11 is formed on the solder resist 10 and connected to the ground potential, in which case characteristic impedance of the single end wire for transmitting a single information signal is decreased as compared with the case of forming none of the metal film 11 on the solder resist 10. The impedance of the single end wire connotes electric resistance (impedance), held by the single end wire, into which the resistance caused by electromagnetic interference is totalized.

Figure 7A:
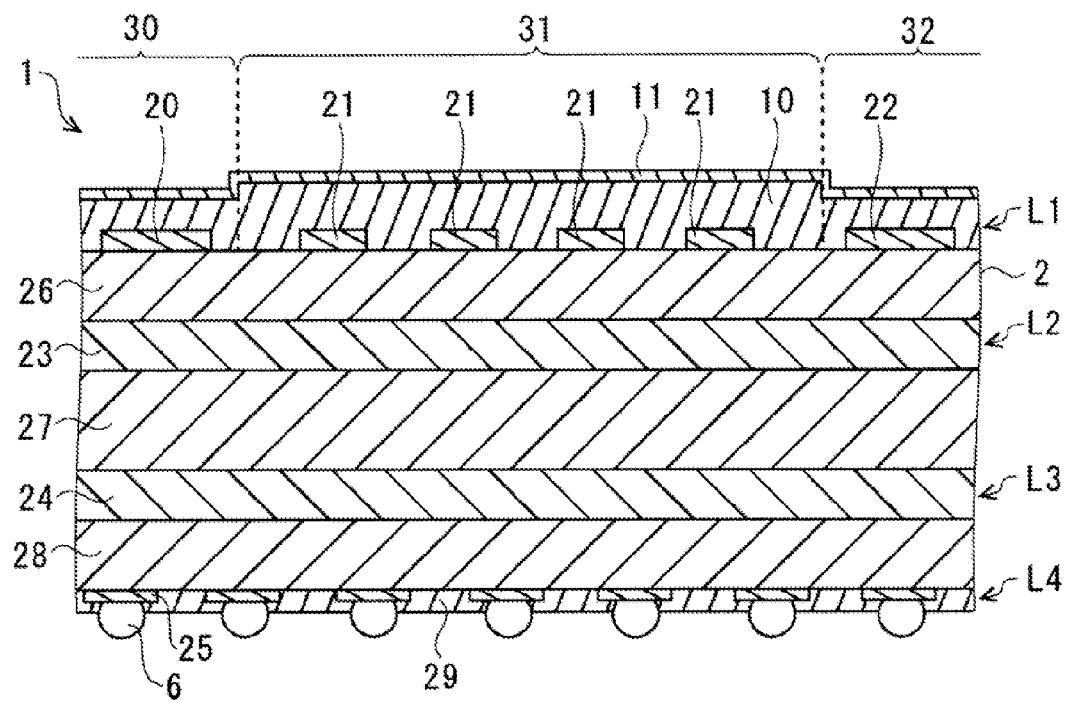
FIG. 7A is a sectional view of the main components of the semiconductor device 1 taken along the dotted line C-C in FIG. 1A as viewed in the arrow direction D.
Figure 7B:
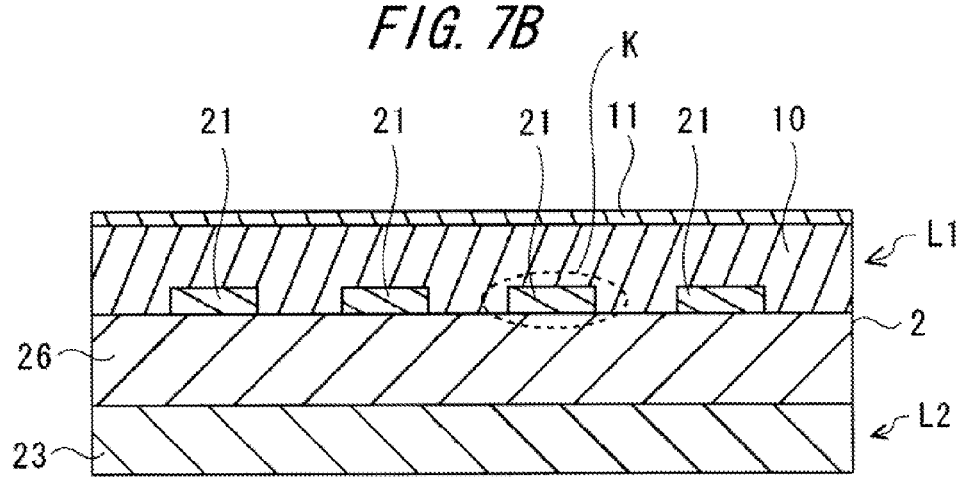
FIG. 7B is a diagram representing a simulation model of the semiconductor device 1 in FIG. 7A.

FIG. 7A is a sectional view of the main components of the semiconductor device 1 taken along the dotted line C-C in FIG. 1A as viewed in the arrow direction D in the case of conducting impedance simulation with respect to the semiconductor device 1 in which the metal film 11 is formed on the solder resist 10. FIG. 7B is a diagram representing a simulation model of the semiconductor device 1 in FIG. 7A. In a case where the signal wire 21 indicated by a symbol K in FIG. 7B is used as the single end wire, a value of the characteristic impedance of the signal wire 21, which is calculated based on the impedance simulation, is 42.25Ω. By contrast, in the case of not forming the metal film 11 on the solder resist 10, the value of the characteristic impedance of the signal wire 21, which is calculated based on the impedance simulation, is 80.61Ω. The impedance simulation involves using, e.g., the following parameters. The parameters are:

the thickness (μm) and an electric conductivity (S/m) of the metal film 11;

the width (μm), the thickness (μm) and the electric conductivity (S/m) of the signal wire 21;

the distance (μm) between the two neighboring signal wires 21;

the thickness (μm) and the relative permittivity (∈r) of the solder resist 10 on the signal wires 21.

the thickness (μm) and the relative permittivity (∈r) of the prepreg 26; and the thickness (μm) and the electric conductivity (S/m) of the ground plane 23.

In the semiconductor device 1 illustrated in FIGS. 7A and 7B, the metal film 11 involves employing copper (Cu), the thickness of the metal film 11 is 5 μm, and the electric conductivity (S/m) of the metal film 11 is given by $5.8 \times 10^7$. In the semiconductor device 1 illustrated in FIGS. 7A and 7B, the signal wire 21 involves using copper (Cu), the width of the signal wire 21 is 40 μm, the thickness of the signal wire 21 is 10 μm, and the electric conductivity (S/m) of the signal wire 21 is given by $5.8 \times 10^7$. In the semiconductor device 1 depicted in FIGS. 7A and 7B, the distance between the two neighboring signal wires 21 is 40 μm. In the semiconductor device 1 illustrated in FIGS. 7A and 7B, the thickness of the solder resist 10 on the signal wires 21 is 25 μm, and the relative permittivity (∈r) of the solder resist 10 on the signal wires 21 is 3.9. In the semiconductor device 1 illustrated in FIGS. 7A and 7B, the thickness of the prepreg 26 is 100 μm, and the relative permittivity (∈r) of the prepreg 26 is 4.9. In the semiconductor device 1 depicted in FIGS. 7A and 7B, the ground plane 23 involves employing copper (Cu), the thickness of the ground plane 23 is 35 μm, and the electric conductivity (S/m) of the ground plane 23 is given by $5.8 \times 10^7$.

The characteristic impedance of the signal wire 21 is, in the case of a lossless line, expressed such as $Z0=(L/C)^{1/2}$. Herein, "L" represents inductance of the signal wire 21, and "C" designates capacitance of the signal wire 21. In the first working example, the metal film 11 is formed on the solder resist 10 and connected to the ground potential. The thickness of the solder resist 10 formed over the signal wires 21 is 25 μm, in which case the distance between the metal film 11 and the signal wire 21 is 25 μm. When the thickness of the prepreg 26 is 100 μm, the distance between the signal wire 21 and the ground plane 23 becomes 100 μm. The metal film 11 connected to the ground potential is formed on the solder resist 10, thereby shortening the distance between the signal wire 21 and the ground as compared with the case of not forming the metal film 11 on the solder resist 10. The distance between the signal wire 21 and the ground is shortened with the result that the value of the inductance (L) of the signal wire 21 decreases, and hence the characteristic impedance of the signal wire 21 comes to have a small value. With the shortened distance between the signal wire 21 and the ground, as discussed with reference to FIG. 6, the electromagnetic-field-like coupling occurs between the metal film 11 and the signal wire 21, then the inductance (L) of the signal wire 21 comes to have the small value, so that the characteristic impedance of the signal wire 21 has a decreased value.

It is desirable that a value of input and output impedance of the semiconductor element 3 is matched with the value of the characteristic impedance of the signal wire 21, thereby restraining reflection of the electric signal through the signal wire 21. When the value of the input and output impedance of the semiconductor element 3 is set to, e.g., 50Ω, the metal film 11 connecting with the ground potential is formed on the solder resist 10, and the value of the characteristic impedance of the signal wire 21 is thereby made approximate to the value of the input and output impedance of the semiconductor element 3.

<Control of Characteristic Impedance of Signal Wire 21 (Single End)>

Figures 8A, 8B:
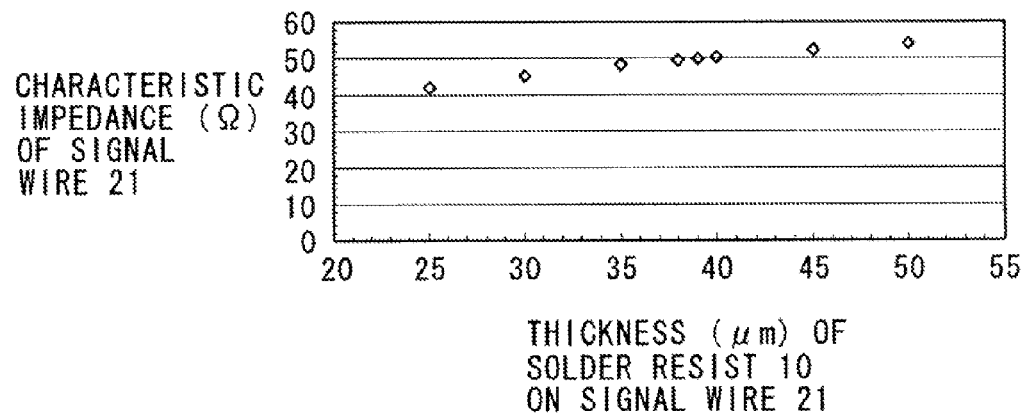
FIG. 8A is a correspondence table representing how the value of the thickness (μm) of a solder resist 10 corresponds to the value of the characteristic impedance (Ω) of a signal wire 21.
FIG. 8B is a correspondence graph of the value of the thickness (μm) of the solder resist 10 and the value of the characteristic impedance (Ω) of the signal wire 21.

It is checked whether or not the value of the characteristic impedance of the signal wire 21 varies corresponding to the distance between the metal film 11 and the signal wire 21, i.e., corresponding to the thickness of the solder resist 10 formed on the signal wires 21, and the variations in value of the characteristic impedance of the signal wire 21 are given in FIGS. 8A and 8B. Categories and values of the parameters other than the thickness of the solder resist 10 are the same as those in the semiconductor device 1 illustrated in FIGS. 7A and 7B. FIG. 8A is a correspondence table representing how the value of the thickness (μm) of the solder resist 10 formed on the signal wires 21 corresponds to the value of the characteristic impedance (Ω) of the signal wire 21. FIG. 8B is a correspondence graph of the value of the thickness (μm) of the solder resist 10 formed on the signal wires 21 and the value of the characteristic impedance (Ω) of the signal wire 21.

As illustrated in FIGS. 8A and 8B, in the semiconductor device 1 where the metal film 11 is formed on the solder resist 10, the value of the characteristic impedance of the signal wire 21 increases and decreases corresponding to the increase and the decrease in thickness of the solder resist 10 formed over the signal wires 21. As depicted in FIGS. 8A and 8B, in the semiconductor device 1 where the metal film 11 is formed on the solder resist 10, as the solder resist 10 formed on the signal wires 21 has the larger thickness, the characteristic impedance of the signal wire 21 has the larger value. As illustrated in FIGS. 8A and 8B, in the semiconductor device 1 where the metal film 11 is formed on the solder resist 10, as the solder resist 10 formed on the signal wires 21 has the smaller thickness, the characteristic impedance of the signal wire 21 has the smaller value.

For instance, the value of the input and output impedance of the semiconductor device 1 is set to 50Ω, in which case it is desirable that the value of the characteristic impedance of the signal wire 21 is made to approximate to 50Ω. The value of the characteristic impedance of the signal wire 21 is made to approximate to 50Ω, and hence it is preferable that the thickness of the solder resist 10 formed on the signal wires 21 is set equal to or larger than 35 μm and equal to or smaller than 45 μm. The value of the characteristic impedance of the signal wire 21 is made to approximate to 50Ω, and it is therefore more preferable that the thickness of the solder resist 10 formed on the signal wires 21 is set to 39 μm.

As explained with reference to FIG. 6, in the semiconductor device 1, the metal film 11 is formed on the solder resist 10, thereby enabling the value of the characteristic impedance of the signal wire 21 to be reduced. Further, as described with reference to FIGS. 8A and 8B, in the semiconductor device 1 where the metal film 11 is formed on the solder resist 10, the value of the characteristic impedance of the signal wire 21 increases and decreases corresponding to the increase and the decrease in thickness of the solder resist 10 formed over the signal wires 21. The value of the characteristic impedance of the signal wire 21 increases when the thickness of the solder resist 10 formed on the signal wires 21 becomes large, but the value of the characteristic impedance of the signal wire 21 decreases when the thickness of the solder resist 10 formed on the signal wires 21 becomes small. Thus, in the semiconductor device 1 where the metal film 11 is formed on the solder resist 10, there is a proportional relationship between the value of the thickness of the solder resist 10 formed over the signal wires 21 and the value of the characteristic impedance of the signal wire 21. Accordingly, the value of the characteristic impedance of the signal wire 21 may be set to a desired value in such a way that the thickness of the solder resist 10 formed on the signal wires 21 is controlled to be a predetermined value. For example, the relationship between the value of the thickness of the solder resist 10 formed on the signal wires 21 and the value of the characteristic impedance of the signal wire 21, is acquired beforehand by an experiment or by simulation. Then, the solder resist 10 having the predetermined thickness is formed on the signal wires 21, and the metal film 11 is formed on the solder resist 10, whereby the value of the characteristic impedance of the signal wire 21 of the semiconductor device 1 may be set to a desired value.

<Calculation of Capacitance of Power Plane 20>

Capacitance simulation will hereinafter be described with reference to FIGS. 9A-12B. A case of conducting the capacitance simulation with respect to the semiconductor device 1 in which the metal film 11 is not formed on the solder resist 10, will hereinafter be described with reference to FIGS. 9A, 9B, 10A and 10B. Further, a case of performing the capacitance simulation with respect to the semiconductor device 1 in which the metal film 11 is formed on the solder resist 10, will hereinafter be described with reference to FIGS. 11A, 11B, 12A and 12B.

Figure 9A:
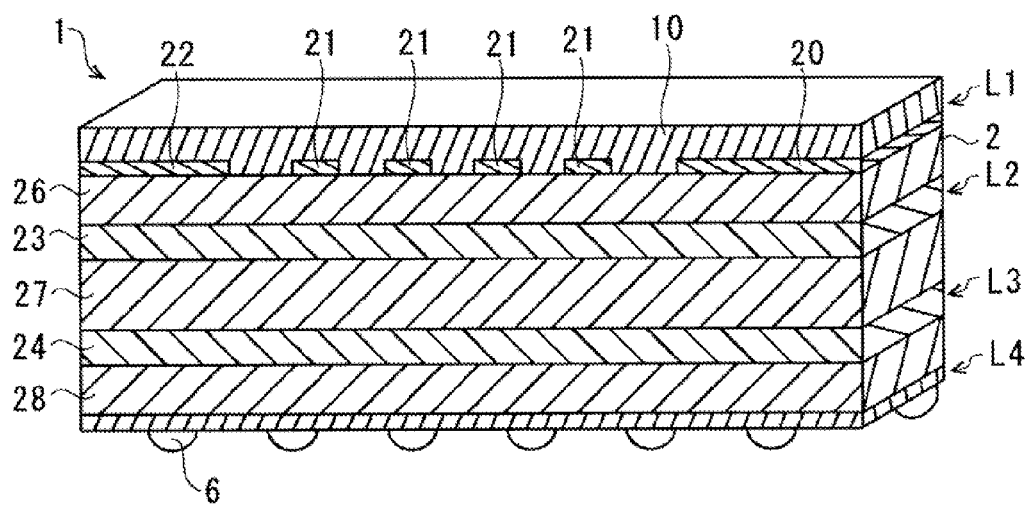
FIG. 9A is a schematic sectional view of the main components of the semiconductor device 1 taken along the dotted line C-C in FIG. 5A as viewed in the arrow direction E.
Figure 9B:
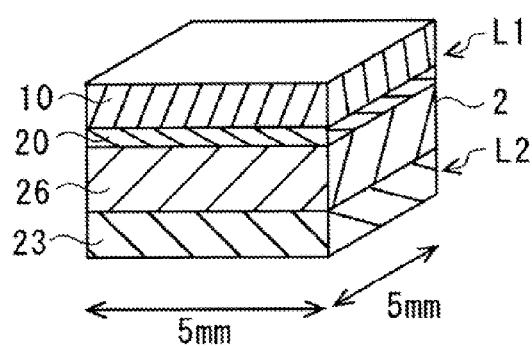
FIG. 9B is a view illustrating a simulation model of semiconductor device 1 in FIG. 9A.

FIG. 9A is a schematic sectional view of the main components of the semiconductor device 1 taken along the dotted line C-C in FIG. 5A as viewed in the arrow direction E in the case of conducting the capacitance simulation with respect to the semiconductor device 1 in which the metal film 11 is not formed on the solder resist 10. FIG. 9B is a view illustrating a simulation model of semiconductor device 1 in FIG. 9A.

The capacitance simulation with respect to the semiconductor device 1 illustrated in FIGS. 9A and 9B involves using the following parameters, which are:

an area ($mm^2$), the thickness (μm) and the electric conductivity (S/m) of the power plane 20;

the thickness (μm) and the relative permittivity (∈r) of the solder resist 10 on the power plane 20;

the thickness (μm) and the relative permittivity (∈r) of the prepreg 26; and the thickness (μm) and the electric conductivity (S/m) of the ground plane 23.

In the semiconductor device 1 illustrated in FIGS. 9A and 9B, the power plane 20 involves employing copper (Cu), the area of the power plane 20 is 25 $mm^2$, the thickness of the power plane 20 is 10 μm, and the electric conductivity (S/m) of the power plane 20 is given by $5.8 \times 10^7$. In the semiconductor device 1 illustrated in FIGS. 9A and 9B, the thickness of the solder resist 10 formed on the power plane 20 is equal to or larger than 15 μm and equal to or smaller than 40 μm, and the relative permittivity (∈r) of the solder resist 10 is 3.9. In the semiconductor device 1 illustrated in FIGS. 9A and 9B, the thickness of the prepreg 26 is 100 μm, and the relative permittivity (∈r) of the prepreg 26 is 4.9. In the semiconductor device 1 depicted in FIGS. 9A and 9B, the ground plane 23 involves employing copper (Cu), the thickness of the ground plane 23 is 35 μm, and the electric conductivity (S/m) of the ground plane 23 is given by $5.8 \times 10^7$.

Figures 10A, 10B:
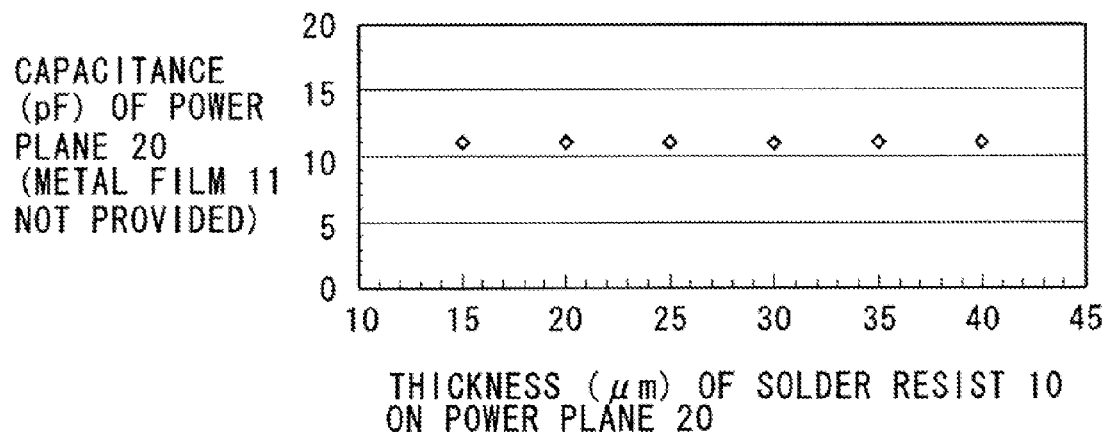
FIG. 10A is a correspondence table representing how the value of the thickness (μm) of the solder resist 10 corresponds to the value of the capacitance (pF) of a power plane 20.
FIG. 10B is a correspondence graph of the value of the thickness (μm) of the solder resist 10 and the value of the capacitance (pF) of the power plane 20.

FIGS. 10A and 10B illustrate results of performing the capacitance simulation with respect to the power plane 20 that is 5 mm square in FIGS. 9A and 9B. FIG. 10A is a correspondence table representing how the value of the thickness (μm) of the solder resist 10 formed on the power plane 20 corresponds to the value of the capacitance (pF) of the power plane 20 that is 5 mm square. FIG. 10B is a correspondence graph of the value of the thickness (μm) of the solder resist 10 formed on the power plane 20 and the value of the capacitance (pF) of the power plane 20 that is 5 mm square.

Figure 11A:
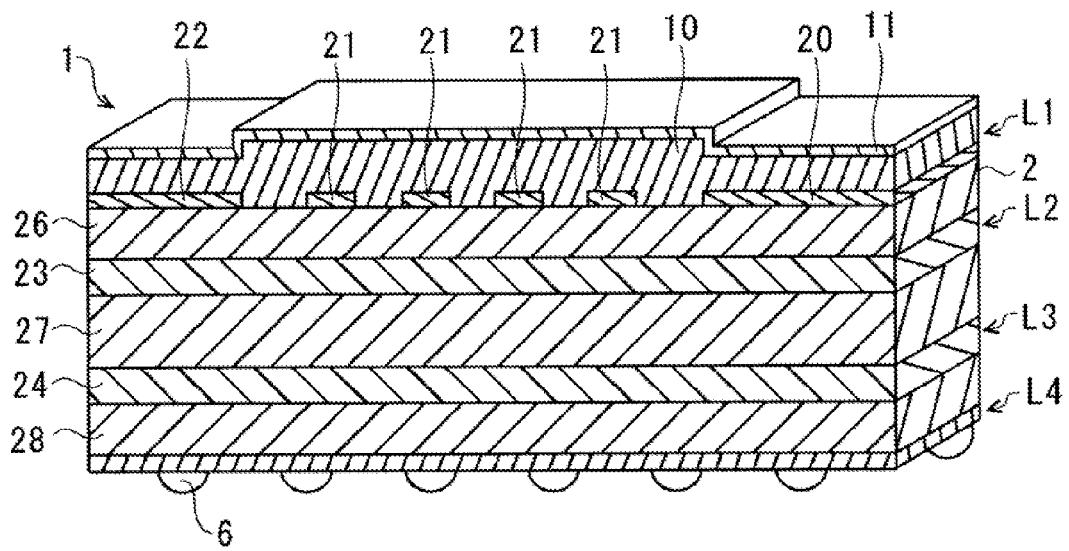
FIG. 11A is a schematic sectional view of the main components of the semiconductor device 1 taken along the dotted line C-C in FIG. 1A as viewed in the arrow direction E.
Figure 11B:
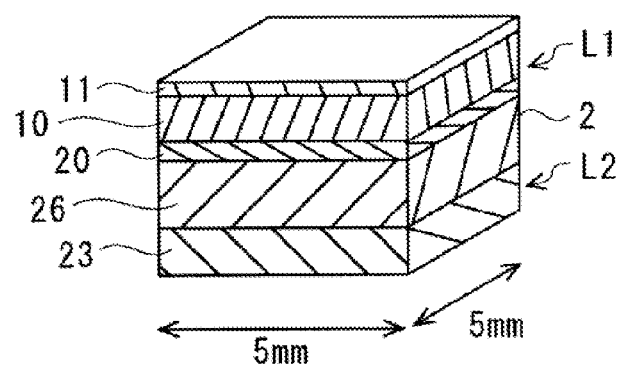
FIG. 11B is a view illustrating a simulation model of semiconductor device 1 in FIG. 11A.

FIG. 11A is a schematic sectional view of the main components of the semiconductor device 1 taken along the dotted line C-C in FIG. 1A as viewed in the arrow direction E in the case of conducting the capacitance simulation with respect to the semiconductor device 1 in which the metal film 11 is formed on the solder resist 10. FIG. 11B is a view illustrating a simulation model of semiconductor device 1 in FIG. 11A.

The capacitance simulation with respect to the semiconductor device 1 illustrated in FIGS. 11A and 11B involves using the following parameters, which are:

the thickness (μm) and the electric conductivity (S/m) of the metal film 11;

the area ($mm^2$), the thickness (μm) and the electric conductivity (S/m) of the power plane 20;

the thickness (μm) and the relative permittivity (∈r) of the solder resist 10 on the power plane 20;

the thickness (μm) and the relative permittivity (∈r) of the prepreg 26; and the thickness (μm) and the electric conductivity (S/m) of the ground plane 23.

In the semiconductor device 1 illustrated in FIGS. 11A and 11B, the metal film 11 involves employing copper (Cu), the thickness of the metal film 11 is 5 μm, and the electric conductivity (S/m) of the metal film 11 is given by $5.8 \times 10^7$. In the semiconductor device 1 illustrated in FIGS. 11A and 11B, the power plane 20 involves using copper (Cu), the area of the power plane 20 is 25 $mm^2$, the thickness of the power plane 20 is 10 μm, and the electric conductivity (S/m) of the power plane 20 is given by $5.8 \times 10^7$. In the semiconductor device 1 depicted in FIGS. 11A and 11B, the thickness of the solder resist 10 formed on the power plane 20 is equal to or larger than 15 μm and equal to or smaller than 40 μm, and the relative permittivity (∈r) of the solder resist 10 is 3.9. In the semiconductor device 1 illustrated in FIGS. 11A and 11B, the thickness of the prepreg 26 is 100 μm, and the relative permittivity (∈r) of the prepreg 26 is 4.9. In the semiconductor device 1 depicted in FIGS. 11A and 11B, the ground plane 23 involves employing copper (Cu), the thickness of the ground plane 23 is 35 μm, and the electric conductivity (S/m) of the ground plane 23 is given by $5.8 \times 10^7$.

Figures 12A, 12B:
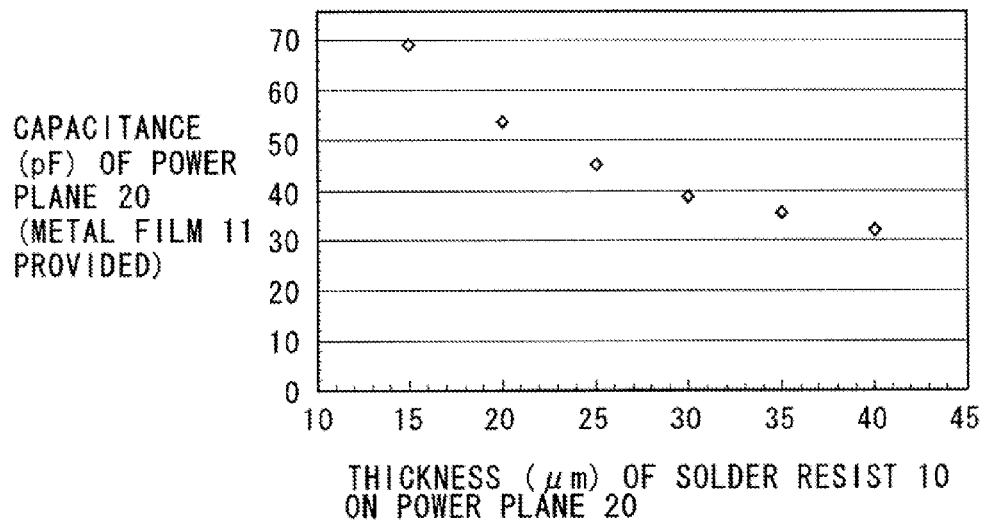
FIG. 12A is a correspondence table representing how the value of the thickness (μm) of the solder resist 10 corresponds to the value of the capacitance (pF) of the power plane 20.
FIG. 12B is a correspondence graph of the value of the thickness (μm) of the solder resist 10 and the value of the capacitance (pF) of the power plane 20.

FIGS. 12A and 12B represent results of performing the capacitance simulation with respect to the power plane 20 that is 5 mm square in FIGS. 11A and 11B. FIG. 12A is a correspondence table representing how the value of the thickness (μm) of the solder resist 10 formed on the power plane 20 corresponds to the value of the capacitance (pF) of the power plane 20 that is 5 mm square. FIG. 12B is a correspondence graph of the value of the thickness (μm) of the solder resist 10 formed on the power plane 20 and the value of the capacitance (pF) of the power plane 20 that is 5 mm square.

As illustrated in FIGS. 10A and 10B, in the semiconductor device 1 where none of the metal film 11 is formed on the solder resist 10, the capacitance of the power plane 20 takes an almost fixed value irrespective of the increase and the decrease in thickness of the solder resist 10 formed on the power plane 20. Namely, in the semiconductor device 1 where the metal film 11 is not formed on the solder resist 10, the value of the capacitance of the power plane 20 does not depend on the thickness of the solder resist 10 formed on the power plane 20. While on the other hand, as illustrated in FIGS. 12A and 12B, in the semiconductor device 1 where the metal film 11 is formed on the solder resist 10, the value of the capacitance of the power plane 20 increases and decreases corresponding to the increase and the decrease in thickness of the solder resist 10 formed on the power plane 20. As illustrated in FIGS. 12A and 12B, in the semiconductor device 1 where the metal film 11 is formed on the solder resist 10, the capacitance of the power plane 20 takes the larger value as the solder resist 10 formed on the power plane 20 gets thinner.

As illustrated in FIGS. 10A, 10B, 12A and 12B, the metal film 11 is formed on the solder resist 10, in which case the value of the capacitance of the power plane 20 becomes larger than in the case of not forming the metal film 11 on the solder resist 10. Namely, the metal film 11 is formed on the solder resist 10, whereby the function as the decoupling capacitor in the semiconductor device 1 is enhanced as compared with the case of not forming the metal film 11 on the solder resist 10.

As explained with reference to FIGS. 10A, 10B, 12A and 12B, in the semiconductor device 1, the value of the capacitance of the power plane 20 is made larger in the case of forming the metal film 11 on the solder resist 10 than in the case of not forming the metal film 11 on the solder resist 10. As described with reference to FIGS. 12A and 12B, in the semiconductor device 1 where the metal film 11 is formed on the solder resist 10, the value of the capacitance of the power plane 20 increases and decreases corresponding to the increase and the decrease in thickness of the solder resist 10 formed on the power plane 20. As explained with reference to FIGS. 12A and 12B, in the semiconductor device 1 where the metal film 11 is formed on the solder resist 10, the capacitance of the power plane 20 takes the larger value as the solder resist 10 formed on the power plane 20 gets thinner. Thus, in the semiconductor device 1 where the metal film 11 is formed on the solder resist 10, there is an inversely proportional relationship between the value of the thickness of the solder resist 10 formed on the power plane 20 and the value of the capacitance of the power plane 20. Therefore, the thickness of the solder resist 10 formed on the power plane 20 is controlled to the predetermined value, whereby the value of the capacitance of the power plane 20 may be set to the desired value. For instance, the relationship between the value of the thickness of the solder resist 10 formed on the power plane 20 and the value of the capacitance of the power plane 20, is acquired previously by an experiment or by simulation. Then, the solder resist 10 having the predetermined thickness is formed on the power plane 20, and the metal film 11 is formed on the solder resist 10, whereby the value of the capacitance of the power plane 20 of the semiconductor device 1 is set to the desired value. For example, the value of the capacitance of the power plane 20 of the semiconductor device 1 is set large, in which case it is preferable that the thickness of the solder resist 10 formed on the power plane 20 is set equal to or larger than 15 μm and equal to or smaller than 25 μm.

Figure 13:
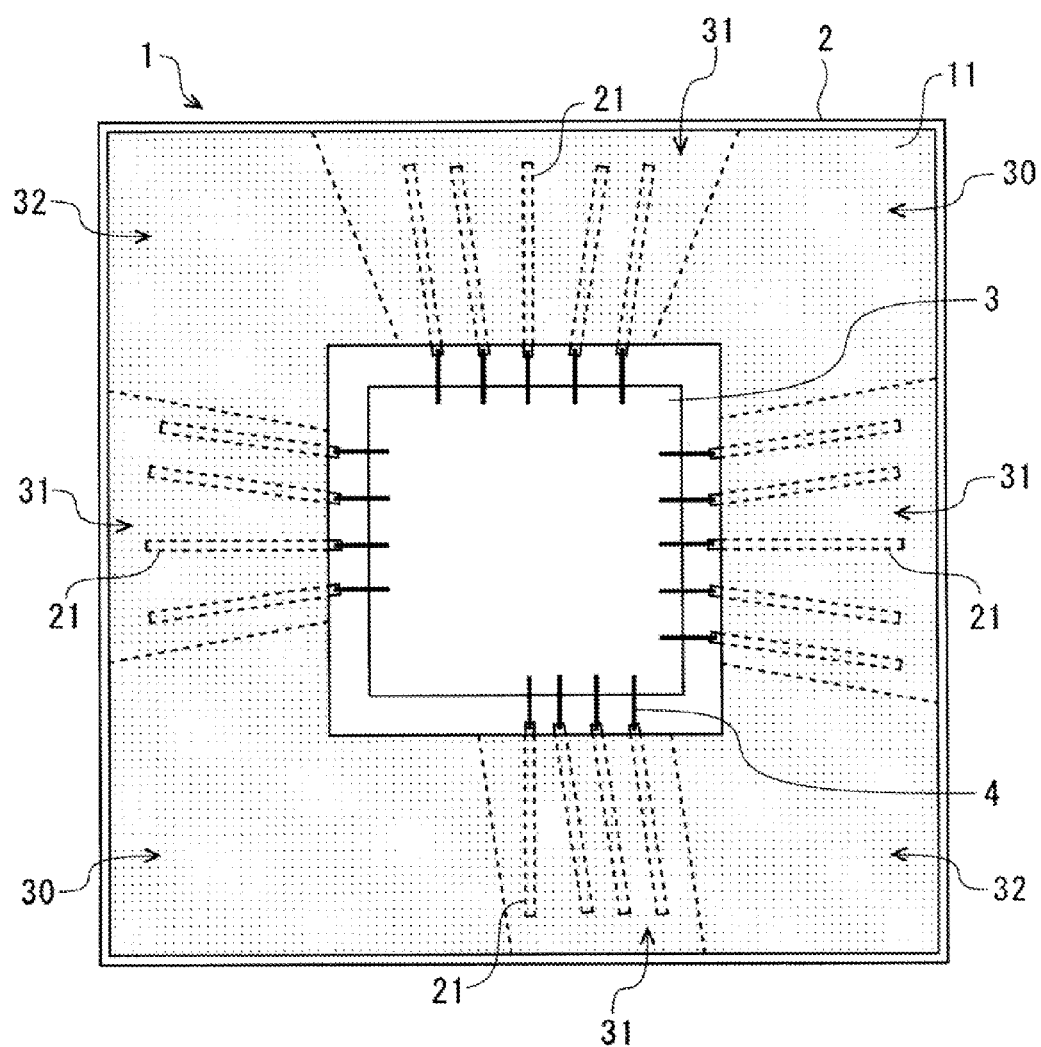
FIG. 13 is a top view of the semiconductor device 1 according to the first working example.

In the semiconductor device 1 according to the first working example, as illustrated in FIG. 13, the position of the power region 30 and the position of the ground region 32 may be reversed. To be specific, in the semiconductor device 1 according to the first working example, there may be reversed the position in which to dispose the power plane 20 and the position in which to dispose the ground plane 22. FIG. 13 is a top view of the semiconductor device 1 according to the first working example.

Modified Example of First Working Example

Figure 14A:
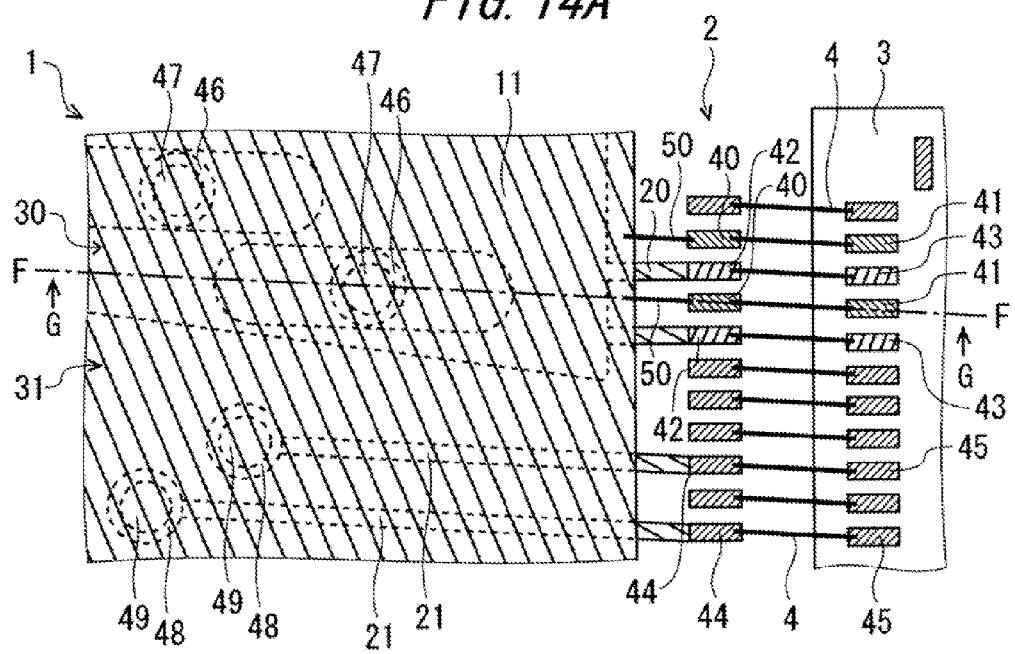
FIG. 14A is an enlarged top view of the semiconductor device 1 according to the modified example of the first working example.
Figure 14B:
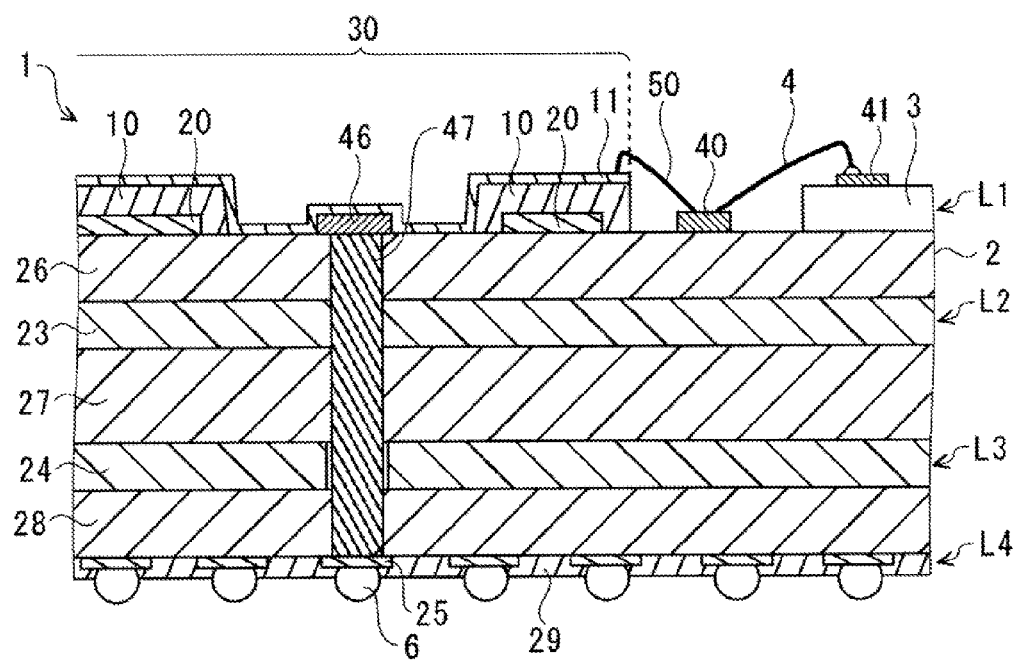
FIG. 14B is a sectional view of the semiconductor device 1 taken along the dotted line F-F in FIG. 14A as viewed in the arrow direction G.

A modified example of the first working example will be described with reference to FIGS. 14A and 14B. In the modified example of the first working example, the metal film 11 may be connected by wire bonding to the ground pads 40 disposed on the wiring board 2. Namely, the metal film 11 may be connected via wires 50 to the ground pads 40 disposed on the wiring board 2. FIG. 14A is an enlarged top view of the semiconductor device 1 according to the modified example of the first working example. FIG. 14A represents the same portion as the region 33 indicated by the alternate long and short dash line in FIG. 1A. FIG. 14B is a sectional view of the semiconductor device 1 taken along the dotted line F-F in FIG. 14A as viewed in the arrow direction G. As depicted in FIGS. 14A and 14B, the metal film 11 is connected via the wires 50 to the ground pads 40 disposed on the wiring board 2. Further, the modified example of the first working example may be applied to a second working example and a third working example which will be discussed later on.

Second Working Example

Figure 15:
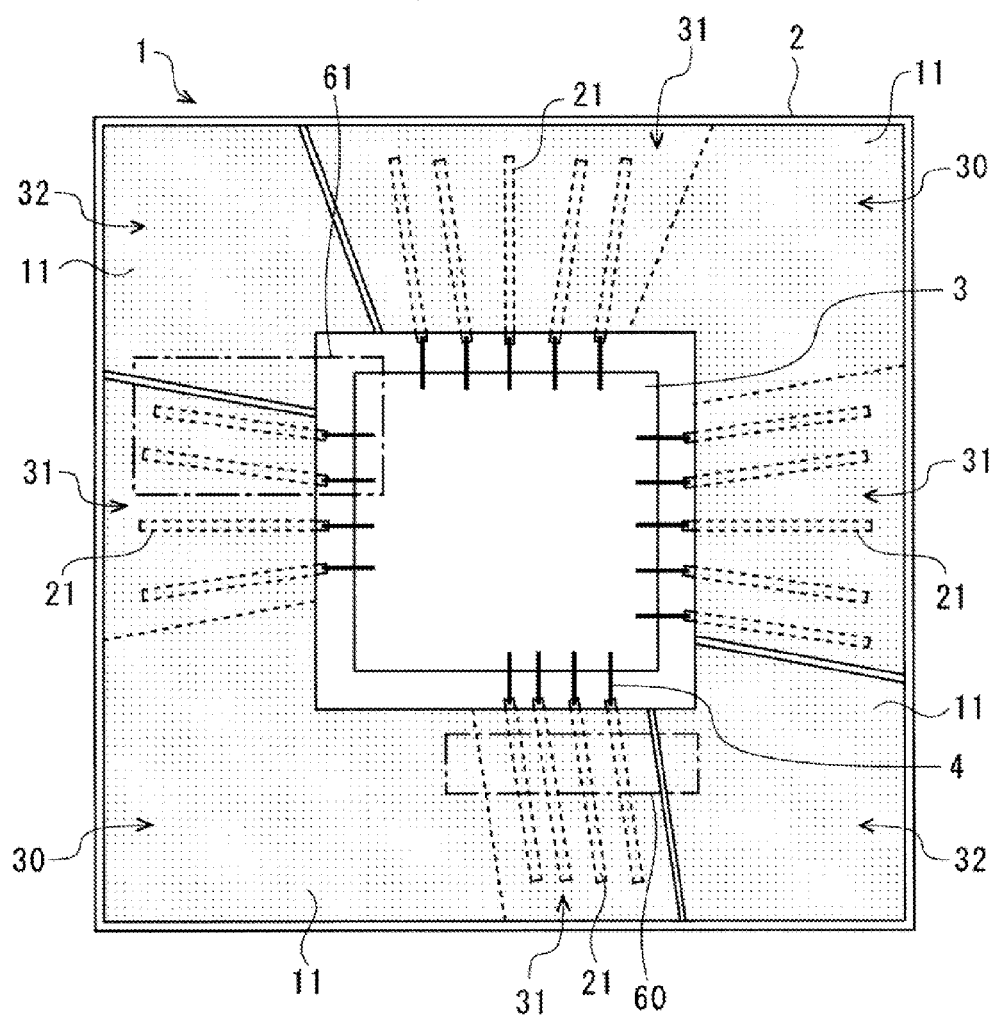
FIG. 15 is a top view of the semiconductor device 1 according to a second working example.

The semiconductor device 1 according to a second working example will be discussed. Note that the same components as those in the first working example are marked with the same reference numerals and symbols as those in the first working example, and the explanations thereof are omitted. FIG. 15 is a top view of the semiconductor device 1 according to the second working example. In the semiconductor device 1 according to the second working example, the metal film 11 is segmented into a plurality of segments. In the semiconductor device 1 illustrated in FIG. 15, the metal film 11 in the power region 30 connects with the metal film 11 in the wire region 31, and the metal films 11 in the power region 30 and the wire region 31 are separated from the metal film 11 in the ground region 32. In the semiconductor device 1 illustrated in FIG. 15, the metal films 11 in the power region 30 and the wire region 31 are connected to the ground potential, while the metal film 11 in the ground region 32 is connected to the power potential.

Figure 16A:
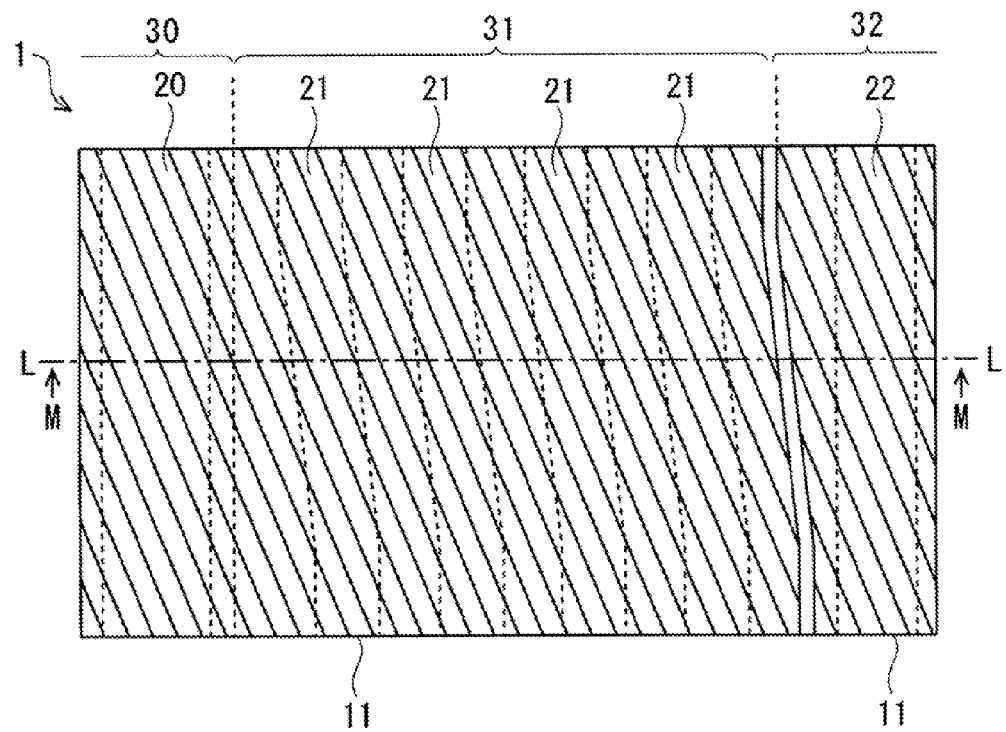
FIG. 16A is an enlarged view of a region 60 indicated by the alternate long and short dash line in FIG. 15.
Figure 16B:
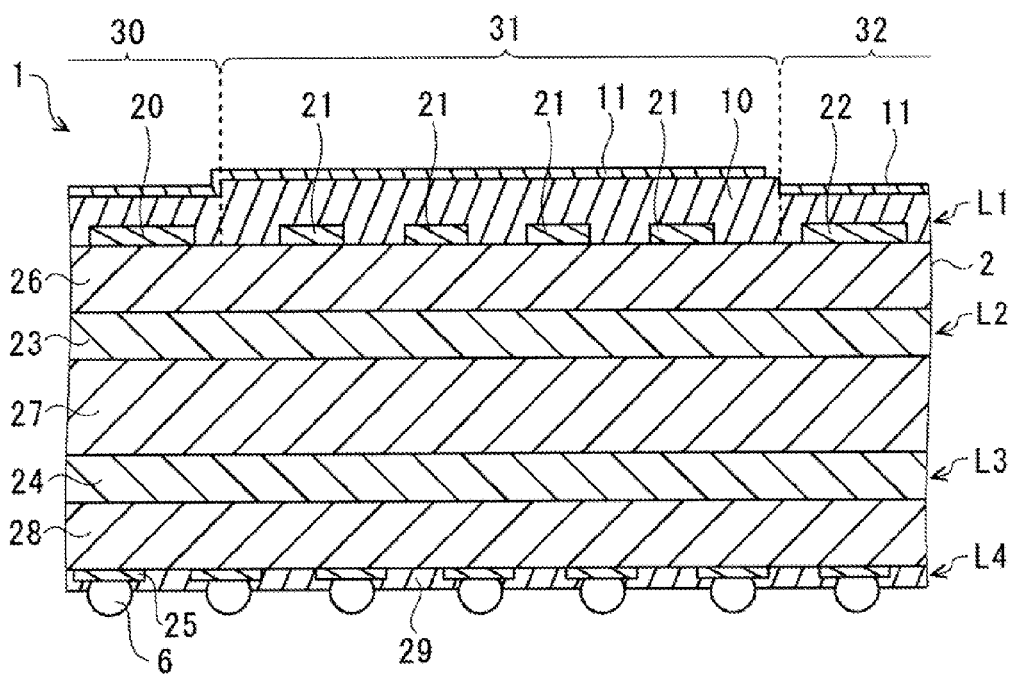
FIG. 16B is a sectional view of the semiconductor device 1 taken along the dotted line L-L in FIG. 16A as viewed in the arrow direction M.
Figure 17A:
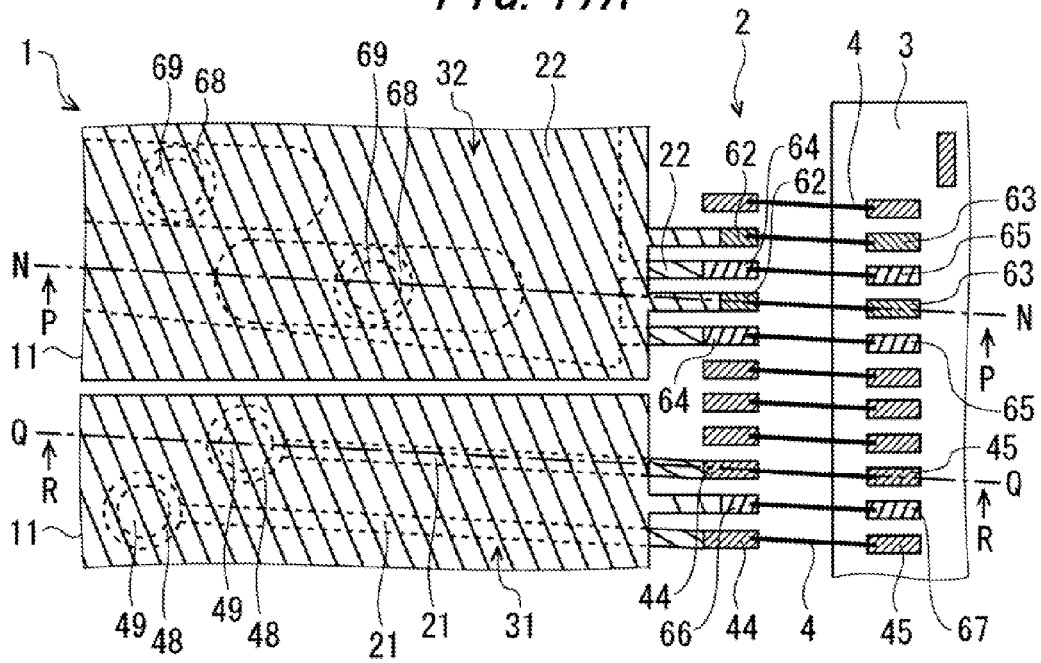
FIG. 17A is an enlarged view of a region 61 indicated by the alternate long and short dash line in FIG. 15.
Figure 17B:
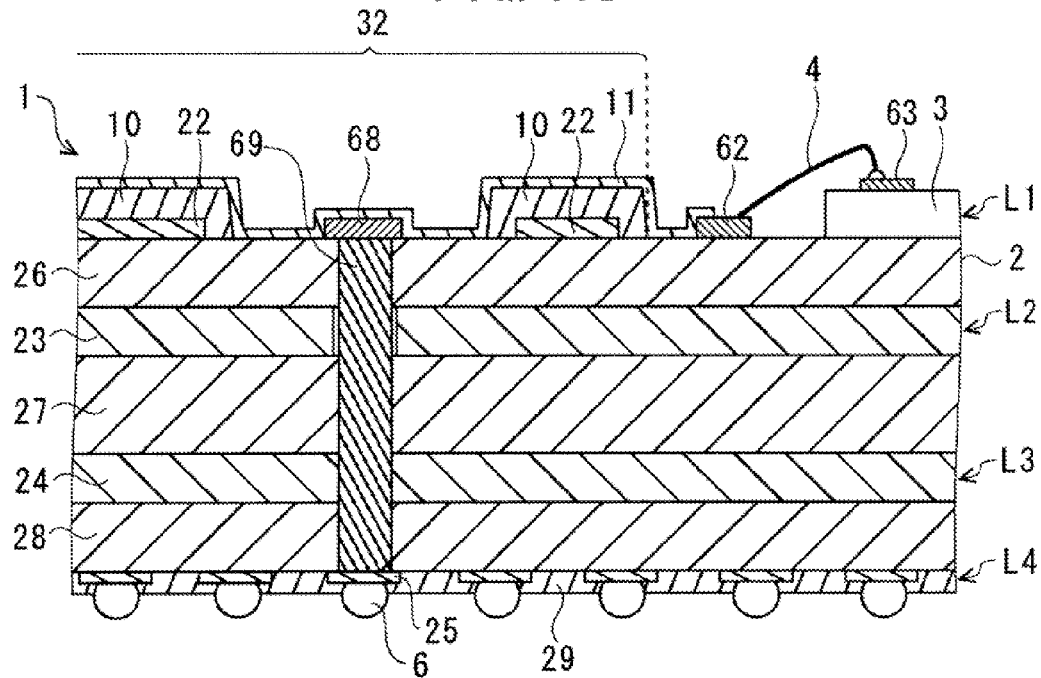
FIG. 17B is a sectional view of the semiconductor device 1 taken along the dotted line N-N in FIG. 17A as viewed in the arrow direction P.
Figure 17C:
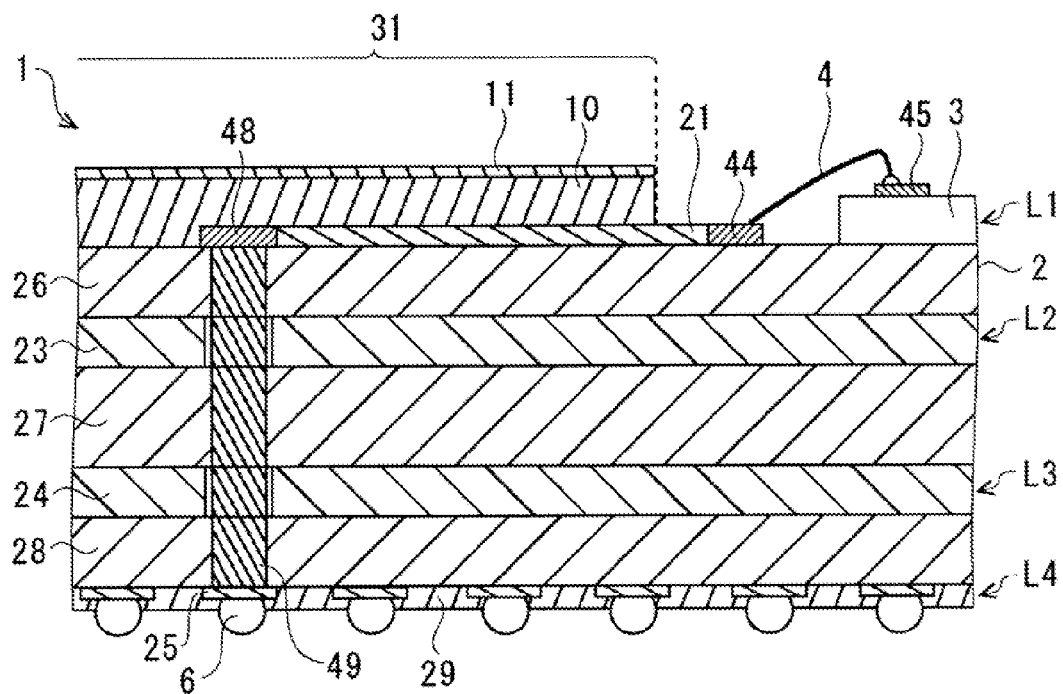
FIG. 17C is a sectional view of the semiconductor device 1 taken along the dotted line Q-Q in FIG. 17A as viewed in the arrow direction R.

FIG. 16A is an enlarged view of a region 60 indicated by the alternate long and short dash line in FIG. 15. FIG. 16B is a sectional view of the semiconductor device 1 taken along the dotted line L-L in FIG. 16A as viewed in the arrow direction M. FIG. 17A is an enlarged view of a region 61 indicated by the alternate long and short dash line in FIG. 15. FIG. 17B is a sectional view of the semiconductor device 1 taken along the dotted line N-N in FIG. 17A as viewed in the arrow direction P. FIG. 17C is a sectional view of the semiconductor device 1 taken along the dotted line Q-Q in FIG. 17A as viewed in the arrow direction R.

As illustrated in FIGS. 16A and 16B, the metal films 11 in the power region 30 and the wire region 31 are so formed as to be joined, while the metal films 11 in the power region 30 and the wire region 31 are separated from the metal film 11 in the ground region 32.

As depicted in FIG. 17A, the metal film 11 in the wire region 31 is separated from the metal film 11 in the ground region 32. As illustrated in FIG. 17A, bonding pads 44, power pads 62, ground pads 64 and a ground pad 66 are provided on the wiring board 2. As illustrated in FIGS. 17A and 17B, the metal film 11 in the ground region 32 connects with the power pads 62 provided on the wiring board 2. The metal film 11 in the ground region 32 is formed in the partially-protruded shape, and the protruded portion of the metal film 11 in the ground region 32 is connected to the power pads 62 provided on the wiring board 2.

As illustrated in FIGS. 17A and 17B, the power pads 62 provided on the wiring board 2 are connected via the wires 4 to power pads 63 provided on the semiconductor element 3. As illustrated in FIG. 17A, the ground plane 22 is formed in the partially-protruded shape, and the protruded portion of the ground plane 22 is connected to the ground pads 64 provided on the wiring board 2. As illustrated in FIG. 17A, the ground pads 64 provided on the wiring board 2 are connected via the wires 4 to ground pads 65 provided on the semiconductor element 3. As depicted in FIG. 17A, the metal film 11 in the wire region 31 is formed in the partially-protruded shape, and the protruded portion of the metal film 11 in the wire region 31 is connected to the ground pad 66 provided on the wiring board 2. As illustrated n in FIG. 17A, the ground pad 66 provided on the wiring board 2 is connected via the wire 4 to a ground pad 67 provided on the semiconductor element 3. As illustrated in FIGS. 17A and 17C, the bonding pads 44 provided on the wiring board 2 are connected via the wires 4 to the bonding pads 45 provided on the semiconductor element 3.

As illustrated in FIG. 17B, a power via land 68 provided on the wiring board 2 is connected to a power via 69 which penetrates the wiring board 2. The power via 69 connects with the power plane 24. Further, as illustrated in FIG. 17B, the metal film 11 in the ground region 32 is connected to the power via land 68. The power via 69 is connected to the power potential via the external electrode pad 25, thereby connecting the metal film 11 in the ground region 32 to the power potential. The thickness of the solder resist 10 formed on the ground plane 22 is, e.g., 15 μm.

Similarly to the first working example, the ground via pad 46 is provided on the wiring board 2. The metal films 11 in the power region 30 and the wire region 31 are, similarly to the first working example, connected to the ground via pads 46 provided on the wiring board 2. Moreover, similarly to the first working example, the ground via pads 46 provided on the wiring board 2 are connected to the ground via 47 penetrating the wiring board 2. Accordingly, the ground via 47 is connected to the ground potential via the external electrode pad 25, and the metal films 11 in the power region 30 and the wire region 31 are connected to the ground potential.

The semiconductor device 1 according to the second working example contains such a region that the solder resist 10 is interposed between the metal film 11 connected to the ground potential and the power plane 20. Accordingly, the metal film 11 connected to the ground potential, the power plane 20 and the solder resist 10 interposed between the metal film 11 connected to the ground potential and the power plane 20, build up the function as the decoupling capacitor in the semiconductor device 1. Further, the semiconductor device 1 according to the second working example contains such a region that the solder resist 10 is interposed between the metal film 11 connected to the power potential and the ground plane 22. Accordingly, the metal film 11 connected to the power potential, the ground plane 22 and the solder resist 10 interposed between the metal film 11 connected to the power potential and the ground plane 22, build up the function as the decoupling capacitor in the semiconductor device 1. Namely, the decoupling capacitor is formed in the ground region 32 of the semiconductor device 1.

As illustrated in FIG. 17C, the signal via land 48 provided on the wiring board 2 is connected to the signal via 49 penetrating the wiring board 2. The thickness of the solder resist 10 formed on the signal wire 21 is, e.g., 25 μm.

In the case of forming the metal film 11 on the solder resist 10 by the vapor deposition, for instance, the metal films 11 are formed separately in the power region 30, the wire region 31 and the ground region 32 by performing the selective vapor deposition on the basis of sputtering which uses the mask. In the case of forming the metal film 11 by plating, for instance, the selective plating is carried out by the electroless plating which employs the mask, whereby the metal films 11 are formed separately in the power region 30, the wire region 31 and the ground region 32.

In the semiconductor device 1 according to the second working example, the metal films 11 in the power region 30 and the wire region 31 are separated from the metal film 11 in the ground region 32. Then, in the semiconductor device 1 according to the second working example, the metal films 11 in the power region 30 and the wire region 31 are connected to the ground potential, while the metal film 11 in the ground region 32 is connected to the power potential. Accordingly, the decoupling capacitor is built up in the power region 30 and the ground region 32 of the semiconductor device 1.

Herein, the result of conducting the capacitance simulation with respect to the ground plane 22 in the semiconductor device 1 illustrated in FIG. 16B is substantially the same as the result of performing the capacitance simulation with respect to the power plane 20 in the semiconductor device 1 illustrated in FIGS. 11A and 11B. Namely, in the semiconductor device 1 where the metal film 11 is formed on the solder resist 10, the value of the capacitance of the ground plane 22 increases and decreases corresponding to the increase and the decrease in thickness of the solder resist 10 formed on the ground plane 22. The capacitance of the ground plane 22 has the larger value in the case of forming the metal film 11 on the solder resist 10 than in the case of not forming the metal film 11 on the solder resist 10. Therefore, the function as the decoupling capacitor in the semiconductor device 1 is more enhanced by forming the metal film 11 on the solder resist 10 than in the case of not forming the metal film 11 on the solder resist 10.

In the semiconductor device 1 where the metal film 11 is formed on the solder resist 10, the capacitance of the ground plane 22 takes the larger value as the solder resist 10 formed on the ground plane 22 gets thinner. Thus, in the semiconductor device 1 where the metal film 11 is formed on the solder resist 10, there is the inversely proportional relationship between the value of the thickness of the solder resist 10 formed on the ground plane 22 and the value of the capacitance of the ground plane 22. Therefore, the thickness of the solder resist 10 formed on the ground plane 22 is controlled to the predetermined value, whereby the value of the capacitance of the ground plane 22 is set to the desired value. For instance, the relationship between the value of the thickness of the solder resist 10 formed on the ground plane 22 and the value of the capacitance of the ground plane 22, is acquired beforehand by an experiment or by simulation. Then, the solder resist 10 having the predetermined thickness is formed on the ground plane 22, and the metal film 11 is formed on the solder resist 10, whereby the value of the capacitance of the ground plane 22 of the semiconductor device 1 is set to the desired value. For example, the value of the capacitance of the ground plane 22 of the semiconductor device 1 is set large, in which case it is preferable that the thickness of the solder resist 10 formed on the ground plane 22 is set equal to or larger than 15 μm and equal to or smaller than 25 μm.

Figure 18:
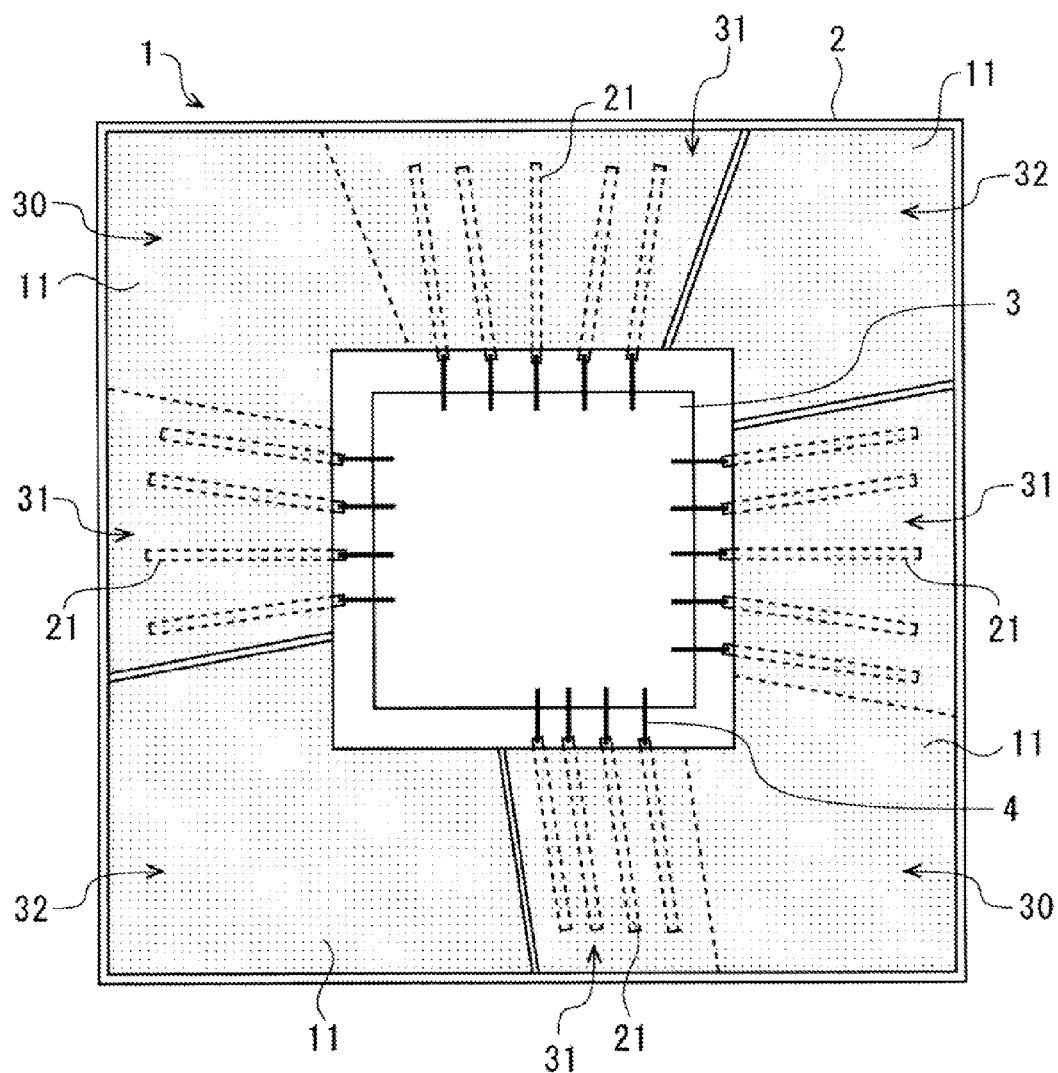
FIG. 18 is a top view of the semiconductor device 1 according to the second working example.

In the semiconductor device 1 according to the second working example, such an instance is exemplified that the position of the power region 30 and the position of the ground region 32 are reversed in comparison with the semiconductor device 1 according to the first working example. In the semiconductor device 1 according to the second working example, however, as illustrated in FIG. 18, the positions of the power region 30 and the ground region 32 may be set the same as those in the semiconductor device 1 according to the first working example. FIG. 18 is a top view of the semiconductor device 1 according to the second working example. In the semiconductor device 1 illustrated in FIG. 18, the metal film 11 in the power region 30 connects with the metal film 11 in the wire region 31, and the metal films 11 in the power region 30 and the wire region 31 are separated from the metal film 11 in the ground region 32. In the semiconductor device 1 illustrated in FIG. 18, the metal films 11 in the power region 30 and the wire region 31 are connected to the ground potential, while the metal film 11 in the ground region 32 is connected to the power potential.

Third Working Example

Figure 19:
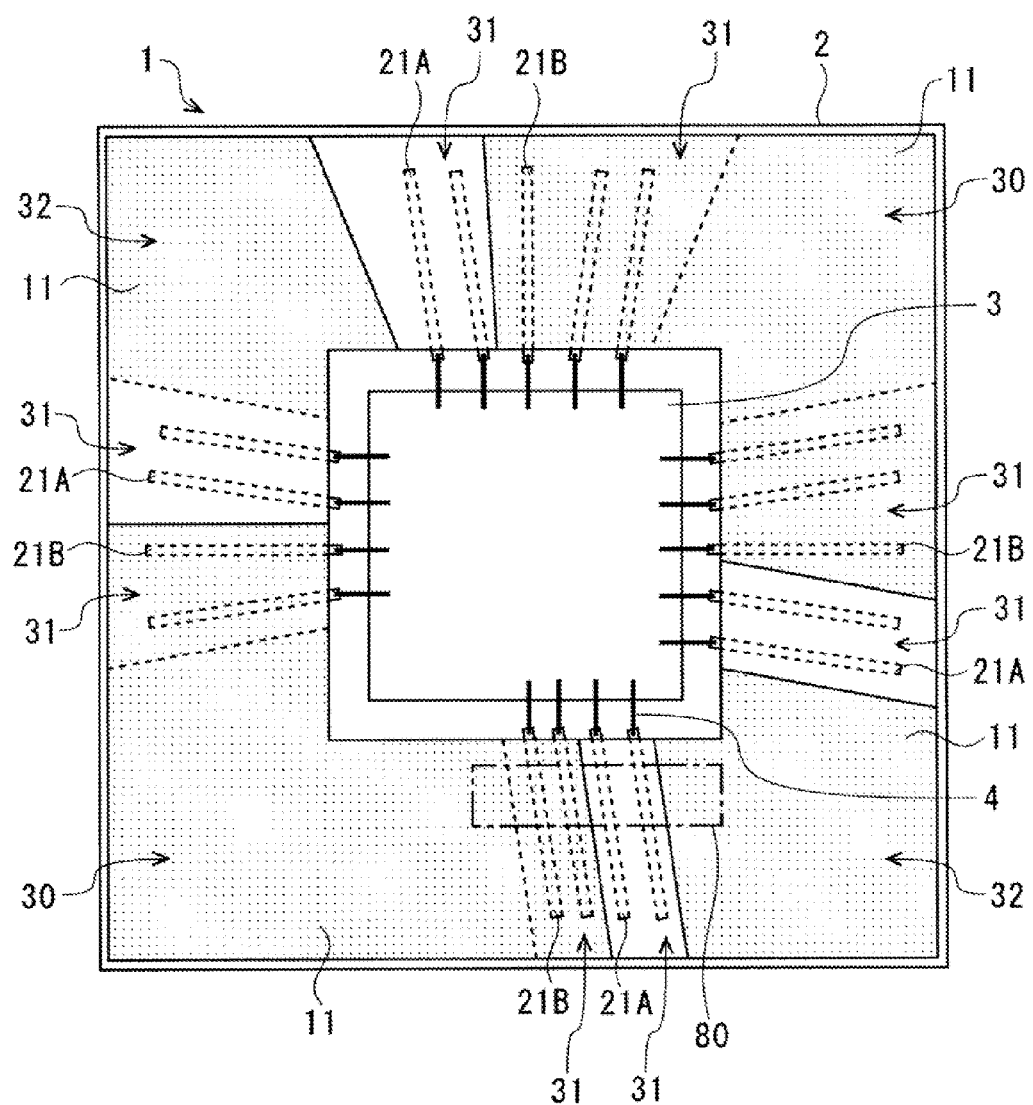
FIG. 19 is a top view of the semiconductor device 1 according to a third working example.

The semiconductor device 1 according to a third working example will be discussed. Note that the same components as those in the first and second working examples are marked with the same reference numerals and symbols as those in the first and second working examples, and the explanations thereof are omitted. FIG. 19 is a top view of the semiconductor device 1 according to the third working example. In the semiconductor device 1 according to the third working example, the metal film 11 is segmented into a plurality of segments. Further, in the semiconductor device 1 according to the third working example, there is such a region that a part of the wire region 31 is not formed with the metal film 11. To be specific, in the semiconductor device 1 according to the third working example, with respect to the solder resist 10 in the wire region 31, there exist a region formed with the metal film 11 and a region formed with none of the metal film 11. In the semiconductor device 1 illustrated in FIG. 19, the metal film 11 in the power region 30 connects with the metal film 11 in the wire region 31, and the metal films 11 in the power region 30 and the wire region 31 are separated from the metal film 11 in the ground region 32. In the semiconductor device 1 illustrated in FIG. 19, the metal films 11 in the power region 30 and the wire region 31 are connected to the ground potential, while the metal film 11 in the ground region 32 is connected to the power potential.

Figure 20A:
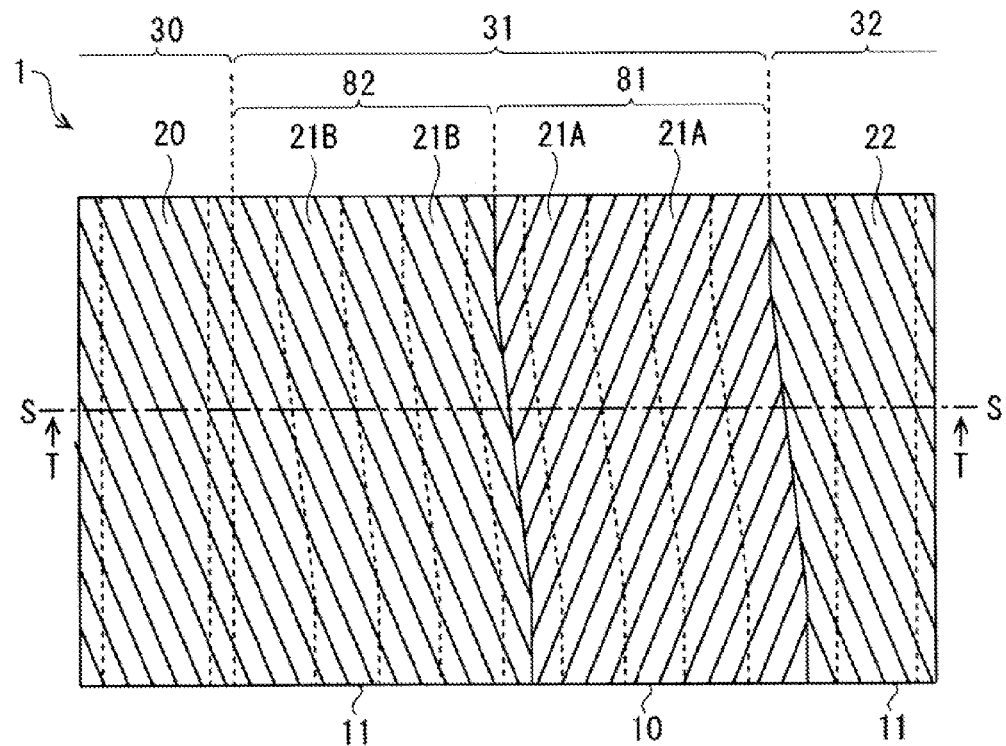
FIG. 20A is an enlarged view of a region 80 indicated by the alternate long and short dash line in FIG. 19.
Figure 20B:
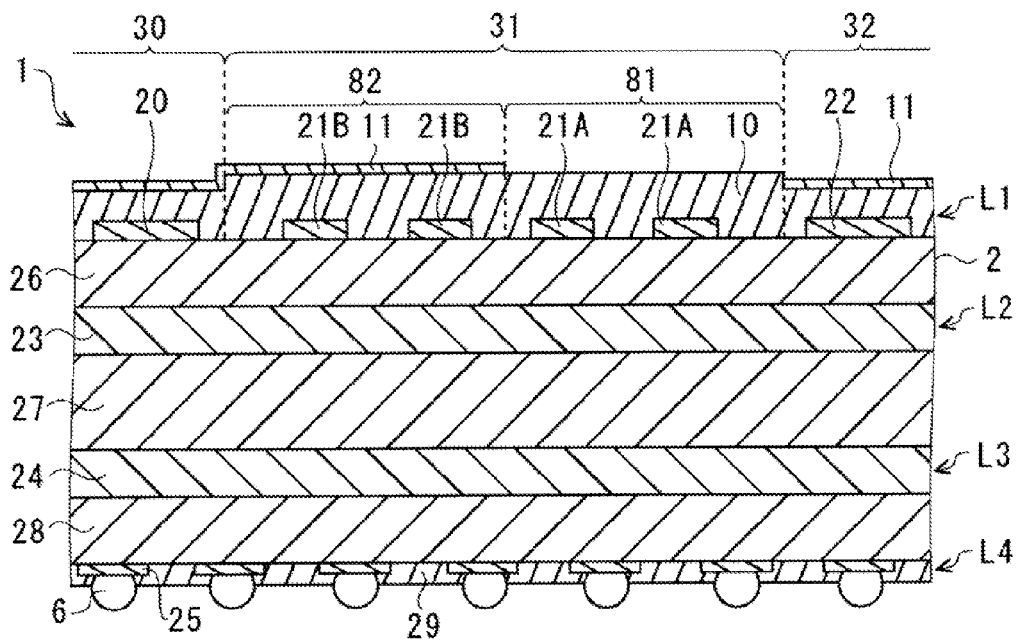
FIG. 20B is a sectional view of the semiconductor device 1 taken along the dotted line S-S in FIG. 20A as viewed in the arrow direction T.

FIG. 20A is an enlarged view of a region 80 indicated by the alternate long and short dash line in FIG. 19. FIG. 20B is a sectional view of the semiconductor device 1 taken along the dotted line S-S in FIG. 20A as viewed in the arrow direction T. In the semiconductor device 1 according to the third working example, two neighboring signal wires 21A are used as differential wires, while a signal wire 21B is employed as a single end wire. Two signal wires are used on a per one signal basis as the differential wires, in which a potential difference between the two signals becomes a signal level. For example, if the potential difference between the two signals is plus, the signal level is recognized to be "High", whereas if the potential difference between the two signals is minus, the signal level is recognized to be "Low". As illustrated in FIGS. 20A and 20B, the metal film 11 is not formed on the solder resist 10 which covers the signal wires 21A serving as the differential wires. Namely, the metal film 11 is not formed in a region (a differential wire region 81) provided with the signal wires 21A used as the differential wires. As illustrated in FIGS. 20A and 20B, the metal film 11 is formed on the solder resist 10 which covers the signal wire 21B used as the single end wire. That is, the metal film 11 is formed in a region (a single end wire region 82) provided with the signal wire 21B employed as the single end wire.

<Calculation of Differential Impedance between Signal Wires 21A (Differential Wires)>

Figure 21A:
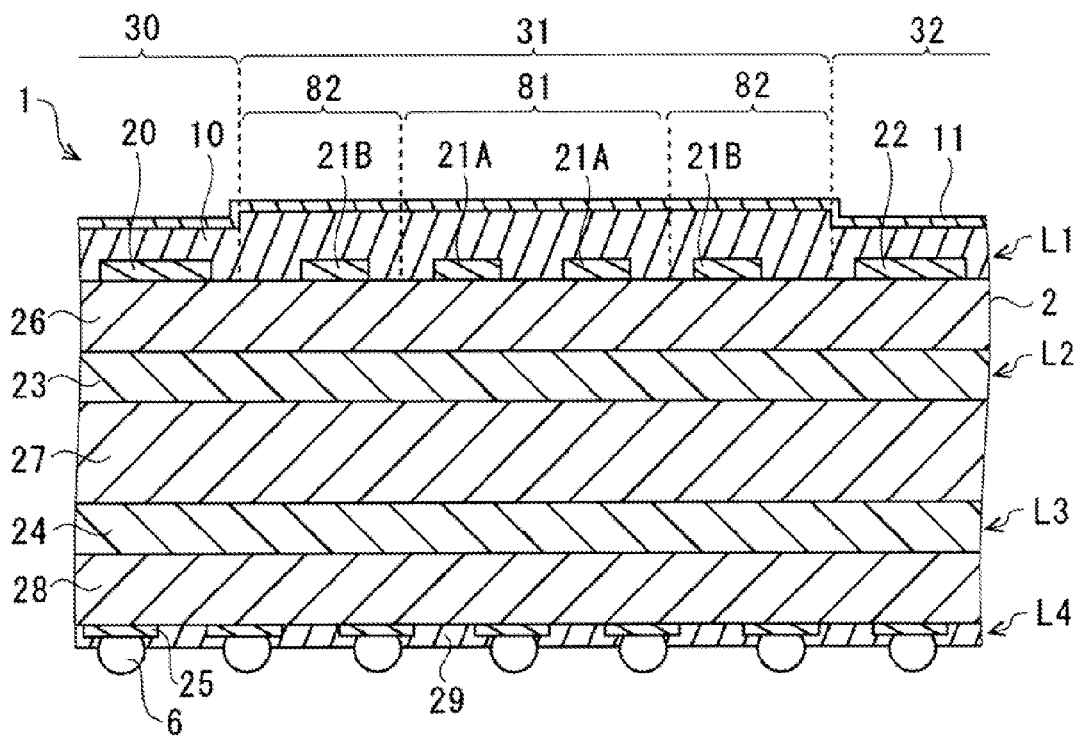
FIG. 21A is a sectional view of the semiconductor device 1 in the case of forming the metal film 11 in a differential wire region 81.
Figure 21B:
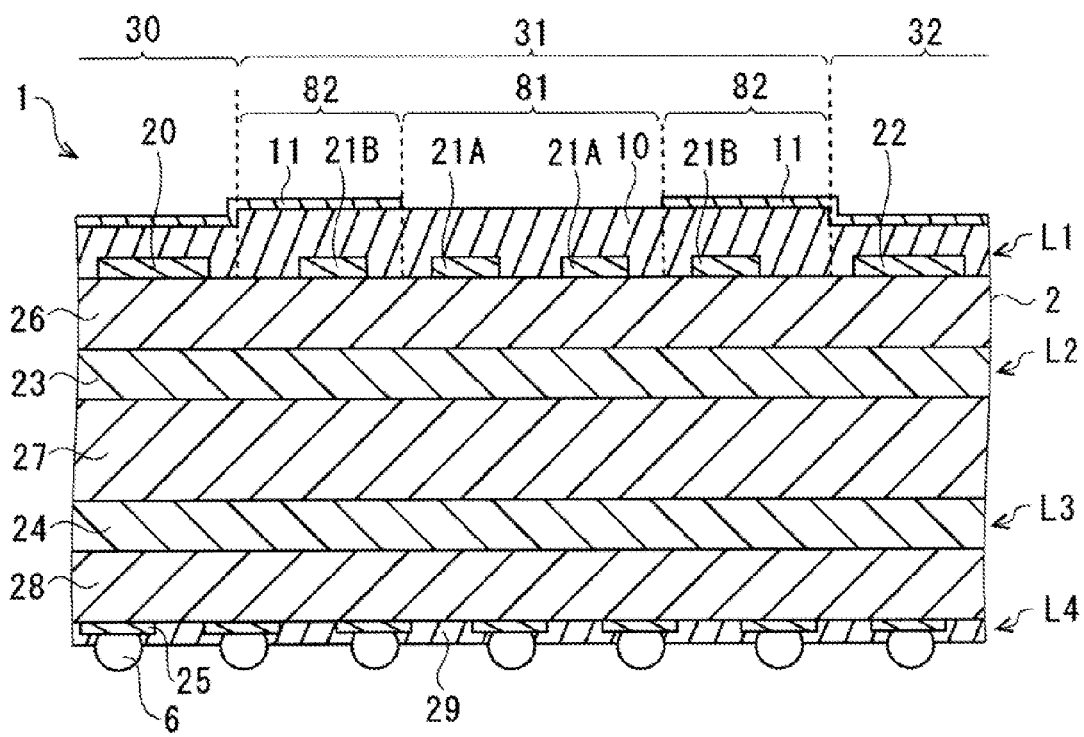
FIG. 21B is a sectional view of the semiconductor device 1 in the case of not forming the metal film 11 in the differential wire region 81.

FIG. 21A is a sectional view of the semiconductor device 1 in the case of forming the metal film 11 in the differential wire region 81. The two signal wires 21A provided in the semiconductor device 1 illustrated in FIG. 21A are used as the differential wires, in which case a value of differential impedance between the differential wires, which is calculated based on impedance simulation, is 82.30Ω. To be specific, in the case of forming the metal film 11 in the differential wire region 81, the value of the differential impedance between the differential wires is 82.30Ω. FIG. 21B is a sectional view of the semiconductor device 1 in the case of not forming the metal film 11 in the differential wire region 81. The two signal wires 21A provided in the semiconductor device 1 illustrated in FIG. 21B are used as the differential wires, in which case the value of the differential impedance between the differential wires, which is calculated based on the impedance simulation, is 95.77Ω. Specifically, in the case of not forming the metal film 11 in the differential wire region 81, the value of the differential impedance between the differential wires is 95.77Ω.

The impedance simulation involves using, e.g., the following parameters, which are:

the thickness (μm) and the electric conductivity (S/m) of the metal film 11;

the width (μm), the thickness (μm) and the electric conductivity (S/m) of each of the signal wires 21A and 21B;

the distance (μm) between the two neighboring signal wires 21A;

the distance (μm) between the neighboring signal wires 21A and 21B;

the thickness (μm) and the relative permittivity (∈r) of the solder resist 10 on the signal wires 21A and 21B.

the thickness (μm) and the relative permittivity (∈r) of the prepreg 26; and the thickness (μm) and the electric conductivity (S/m) of the ground plane 23.

In the semiconductor device 1 illustrated in FIGS. 21A and 21B, the metal film 11 involves employing copper (Cu), the thickness of the metal film 11 is 5 μm, and the electric conductivity (S/m) of the metal film 11 is given by $5.8 \times 10^7$. In the semiconductor device 1 illustrated in FIGS. 21A and 21B, the signal wires 21A and 21B involve using copper (Cu), the width of each of signal wires 21A and 21B is 40 μm, the thickness of each of signal wires 21A and 21B is 10 μm, and the electric conductivity (S/m) of each of signal wires 21A and 21B is given by $5.8 \times 10^7$. In the semiconductor device 1 depicted in FIGS. 21A and 21B, the distance between the two neighboring signal wires 21A is 40 μm, and the distance between the neighboring signal wires 21A and 21B is also 40 μm. In the semiconductor device 1 illustrated in FIGS. 21A and 21B, the thickness of the solder resist 10 on the signal wires 21A and 21B is 39 μm, and the relative permittivity (∈r) of the solder resist 10 is 3.9. In the semiconductor device 1 illustrated in FIGS. 21A and 21B, the thickness of the prepreg 26 is 100 μm, and the relative permittivity (∈r) of the prepreg 26 is 4.9. In the semiconductor device 1 depicted in FIGS. 21A and 21B, the ground plane 23 involves employing copper (Cu), the thickness of the ground plane 23 is 35 μm, and the electric conductivity (S/m) of the ground plane 23 is given by $5.8 \times 10^7$.

In the third working example, the metal film 11 is not formed in the differential wire region 81. If the semiconductor element 3 is a differential circuit and if the semiconductor element 3 includes the differential circuit, it is desirable to restrain the reflection of the electric signal by matching a value of an input and output impedance of the differential circuit with a value of differential impedance of the differential wire. When the value of the input and output impedance of the differential circuit is set to, e.g., 100Ω, the capacitance is reduced by not forming the metal film 11 in the differential wire region 81, thereby enabling the value of the differential impedance of the differential wire to approximate the value of input and output impedance of the differential circuit.

In the semiconductor device 1 according to the third working example, such an instance is exemplified that the metal films 11 in the power region 30 and the wire region 31 are connected to the ground potential, and the metal film 11 in the ground region 32 is connected to the power potential. Without being limited to this configuration, in the semiconductor device 1, the metal films 11 in the power region 30 and the wire region 31 may be connected to the ground potential, and the metal film 11 in the ground region 32 may be connected to the ground potential.

Fourth Working Example

Figure 22B:
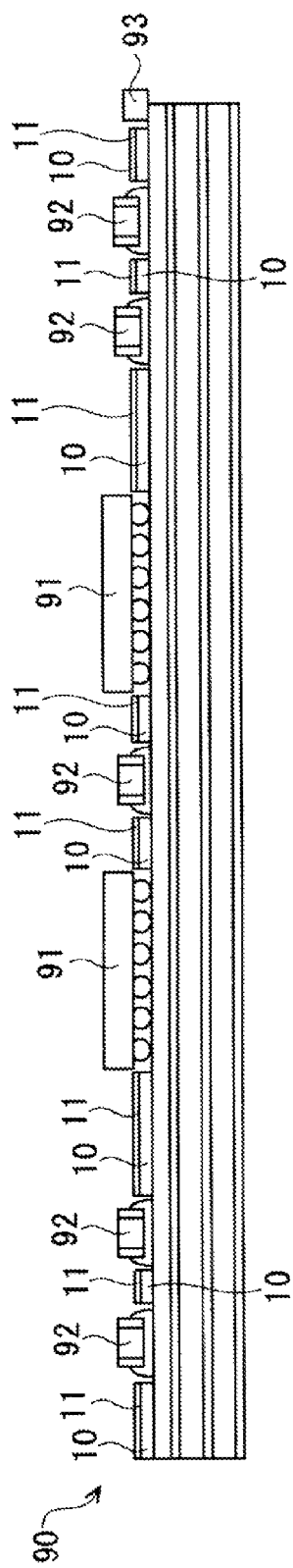
FIG. 22B is a sectional view of the wiring board 90 taken along the alternate long and short dash line U-U in FIG. 22A as viewed in the arrow direction V.

A wiring board 90 according to a fourth working example will be discussed. Note that the same components as those in the first through third working examples are marked with the same reference numerals and symbols as those in the first through third working examples, and the explanations thereof are omitted. FIG. 22A is a top view of the wiring board 90 according to the fourth working example. FIG. 22B is a sectional view of the wiring board 90 taken along the alternate long and short dash line U-U in FIG. 22A as viewed in the arrow direction V.

A plurality of semiconductor devices 91 is disposed on the wiring board 90 illustrated in FIGS. 22A and 22B. The wiring board 90 is, e.g., a printed wiring board. A semiconductor device 91 includes a semiconductor element and an interposer substrate. The semiconductor device 91 is, e.g., a semiconductor package in which the surface of the interposer substrate mounted with the semiconductor element is sealed by a protection member. The semiconductor device 91 is provided with balls for connecting with the wiring board 90. The semiconductor device 91 is packaged on the wiring board 90. The solder resist 10 is formed on the wiring board 90 so as to surround the semiconductor device 91. The solder resist 10 may involve using, e.g., a liquid solder resist and a film-shaped solder resist as well. The metal film 11 is formed on the solder resist 10. Accordingly, the metal film 11 is formed on the solder resist 10 so as to surround the semiconductor device 91.

As illustrated in FIGS. 22A and 22B, passive elements 92 such as resistances and capacitors are provided in the wire regions 31. Further, external connection connectors 93 for connecting the wiring board 90 to an external device are provided on the wiring board 90. On the wiring board 90 illustrated in FIGS. 22A and 22B, the power region 30, the wire region 31 and the ground region 32 are the same as those in the first working example. To be specific, on the wiring board 90, the region formed with the power plane 20 is demarcated as the power region 30, the region formed with the signal wires 21 is demarcated as the wire region 31, and the region formed with the ground plane 22 is demarcated as the ground region 32.

Figure 22C:
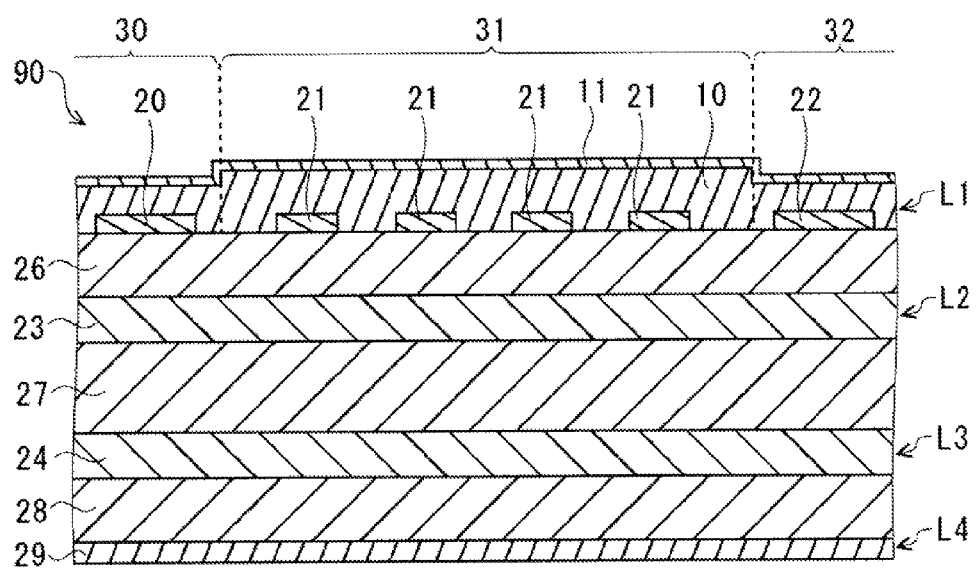
FIG. 22C is a sectional view of main components of the wiring substrate 90 taken along the alternate long and short dash line W-W in FIG. 22A as viewed in the arrow direction X.

FIG. 22C is a sectional view of main components of the wiring substrate 90 taken along the alternate long and short dash line W-W in FIG. 22A as viewed in the arrow direction X. As depicted in FIG. 22C, the wiring board 90 includes the power plane 20, the signal wires 21 and the ground plane 22 in the L1 layer, includes the ground plane 23 in the L2 layer, and includes the power plane 24 in the L3 layer. As illustrated in FIG. 22C, the power plane 20, the signal wires 21 and the ground plane 22 are covered by the solder resist 10. The power planes 20, 24, the signal wires 21 and the ground planes 22, 23 are composed of the metal materials such as copper (Cu). A thickness of each of the power plane 20, the signal wire 21 and the ground plane 22 is, e.g., 10 μm but may, without being limited to this value, take other values. A thickness of each of the ground plane 22 and the power plane 24 is, e.g., 35 μm but may, without being limited to this value, take other values.

Note that the power plane 20 is connected to the power via (unillustrated), and the power via is connected to the power potential, whereby the power plane 20 is connected to the power potential. The ground plane 22 is connected to the ground via (unillustrated), and the ground via is connected to the ground potential, whereby the ground plane 22 is connected to the ground potential.

As illustrated in FIG. 22C, the wiring board 90 includes the prepreg 26 defined as the insulator (dielectric substance) between the L1 layer and the L2 layer, includes the core 27 defined as the insulator (dielectric substance) between the L2 layer and the L3 layer, and includes the prepreg 28 defined as the insulator (dielectric substance) between the L3 layer and the L4 layer. A thickness of each of the prepregs 26, 28 is, e.g., 100 μm but may, without being limited to this value, take other values. A thickness of the core 27 is, e.g., 200 μm but may, without being limited to this value, take other values. The relative permittivity ($\in$r) of each of the prepreg 26, the core 27 and the prepreg 28 is, e.g., 4.9 but may, without being limited to this value, take other values. Further, on the wiring board 90, the solder resist 29 is formed on the surface opposite to the surface on which the semiconductor device 91 is disposed.

As illustrated in FIG. 22C, the wiring board 90 contains such a region that the prepreg 26 is interposed between the power plane 20 and the ground plane 23. Accordingly, the power plane 20, the ground plane 23 and the prepreg 26 interposed between the power plane 20 and the ground plane 23 build up the function as the decoupling capacitor in the wiring board 90. The function as the decoupling capacitor is built up in the wiring board 90, thereby enabling noises such as the simultaneous switching noises to be reduced.

As illustrated in FIG. 22C, the solder resist 10 is formed on the wiring board 90 in a manner that covers the power plane 20, the signal wires 21 and the ground plane 22. In the embodiment, on the wiring board 90, the region formed with the power plane 20 is demarcated as the power region 30, the region formed with the signal wires 21 is demarcated as the wire region 31, and the region formed with the ground plane 22 is demarcated as the ground region 32. The boundary between the power region 30 and the wire region 31 is any set. Further, the boundary between the wire region 31 and the ground region 32 is also any set. A thickness of the solder resist 10 formed in the power region 30 and the ground region 32 is, e.g., 25 μm. When the thickness of each of the power plane 20 and the ground plane 22 is set to 10 μm, the solder resist 10 formed on the power plane 20 and on the ground plane 22 comes to have the thickness of 15 μm. The thickness of the solder resist 10 formed in the wire region 31 is, e.g., 35 μm. When the thickness of the signal wire 21 is set to 10 μm, the thickness of the solder resist 10 formed on the signal wires 21 becomes 25 μm.

In the wiring board 90 illustrated in FIG. 22C, the formation of the solder resist 10 on the wiring board 90 involves using the liquid solder resist 10. In the case of using the liquid solder resist 10, the solder resist 10 having a fixed thickness is formed over along the power region 30, the wire region 31 and the ground region 32. In the case of using the liquid solder resist 10, the thickness of the solder resist 10 is differentiated by changing a coating count of the solder resist 10 on the basis of the power region 30, the ground region 32 and the wire region 31, individually. In FIG. 22C, the solder resist 10 in the wire region 31 is formed thicker than the solder resist 10 in the power region 30 and the ground region 32. In the case of forming the solder resist 10 on the wiring board 90 by use of the film-shaped solder resist 10, similarly to the example illustrated in FIG. 4, the solder resist 10 takes the tongued and grooved shape along the shape of the signal wires 21.

The fourth working example has exemplified the instance of providing the plurality of semiconductor devices 91 on the wiring board 90, however, without being limited to this configuration, one single semiconductor device 91 may also be provided on the wiring board 90.

On the wiring board 90 according to the fourth working example, the metal film 11 may be segmented into the plurality of segments similarly to the semiconductor device 1 according to the second working example. To be specific, on the wiring board 90 according to the fourth working example, the metal film 11 in the power region 30 may connect with the metal film 11 in the wire region 31, and the metal films 11 in the power region 30 and the wire region 31 may be separated from the metal film 11 in the ground region 32. In this case, the metal films 11 in the power region 30 and the wire region 31 are connected to the ground potential, while the metal film 11 in the ground region 32 is connected to the power potential.

On the wiring board 90 according to the fourth working example, similarly to the semiconductor device 1 according to the third working example, the metal film 11 is segmented into the plurality of segments, and a part of the wire region 31 may not be formed with the metal film 11. Namely, on the wiring board 90 according to the fourth working example, the metal film 11 in the power region 30 may connect with the metal film 11 in the wire region 31, and the metal films 11 in the power region 30 and the wire region 31 may be separated from the metal film 11 in the ground region 32. In this case, on the wiring board 90, the metal films 11 in the power region 30 and the wire region 31 may be connected to the ground potential, while the metal film 11 in the ground region 32 may be connected to the power potential. Further, on the wiring board 90, the metal films 11 in the power region 30 and the wire region 31 may be connected to the ground potential, while the metal film 11 in the ground region 32 may be connected to the ground potential. The metal film 11 may not be formed in the region (the differential wire region) formed with the signal wires 21 used as the differential wires. The metal film 11 may be formed in the region (the single end wire region) formed with the signal wire 21 employed as the single end wire.

In the semiconductor device 1 according to the first through third working examples and the wiring board 90 according to the fourth working example, there has been exemplified the instance of including the ground plane 23 in the L2 layer and the power plane 24 in the L3 layer. Without being limited to this configuration, the semiconductor device 1 according to the first through third working examples and the wiring board 90 according to the fourth working example may include, as a substitute for the ground plane 23, the power plane in the L2 layer. Furthermore, the semiconductor device 1 according to the first through third working examples and the wiring board 90 according to the fourth working example may include, as a substitute for the power plane 24, the ground plane in the L3 layer.

In the semiconductor device 1 according to the first through third working examples and the wiring board 90 according to the fourth working example, by way of one example of controlling the thickness of the solder resist 10, the thickness of the solder resist 10 in the wire region 31 is made larger than the thickness of the solder resist 10 in the power region 30 and the ground region 32. To be specific, in the semiconductor device 1 according to the first through third working examples and the wiring board 90 according to the fourth working example, the thickness of the solder resist 10 formed on the signal wires 21 is made larger than the thickness of the solder resist 10 formed on the power plane 20 and the ground plane 22. Then, in the semiconductor device 1 according to the first through third working examples and the wiring board 90 according to the fourth working example, the thickness of the solder resist 10 in the power region 30 and the thickness of the solder resist 10 in the ground region 32 are substantially equalized. Without being limited to this configuration, in the semiconductor device 1 and the wiring board 90, the thicknesses of the solder resists 10 in the power region 30, the wire region 31 and the ground region 32 may be any set.

In the semiconductor device 1 and the wiring board 90, the thickness of the solder resist 10 in the wire region 31 may be made larger than the thickness of the solder resist 10 in the power region 30, and the thickness of the solder resist 10 in the power region 30 may be made larger than the thickness of the solder resist 10 in the ground region 32. In the semiconductor device 1 and the wiring board 90, the thickness of the solder resist 10 in the wire region 31 may be made larger than the thickness of the solder resist 10 in the power region 30, and the thicknesses of the solder resists 10 in the wire region 31 and the ground region 32 may be substantially equalized.

In the semiconductor device 1 and the wiring board 90, the thickness of the solder resist 10 in the wire region 31 may be made larger than the thickness of the solder resist 10 in the ground region 32, and the thickness of the solder resist 10 in the ground region 32 may be made larger than the thickness of the solder resist 10 in the power region 30. In the semiconductor device 1 and the wiring board 90, the thickness of the solder resist 10 in the ground region 32 may be made larger than the thickness of the solder resist 10 in the wire region 31, and the thickness of the solder resist 10 in the wire region 31 may be made larger than the thickness of the solder resist 10 in the power region 30.

In the semiconductor device 1 and the wiring board 90, the thickness of the solder resist 10 in the wire region 31 may be made larger than the thickness of the solder resist 10 in the power region 30, and the thicknesses of the solder resists 10 in the wire region 31 and the ground region 32 may be substantially equalized. In the semiconductor device 1 and the wiring board 90, the thickness of the solder resist 10 in the wire region 31 may be made larger than the thickness of the solder resist 10 in the ground region 32, and the thicknesses of the solder resists 10 in the power region 30 and the wire region 31 may be substantially equalized. In the semiconductor device 1 and the wiring board 90, the thickness of the solder resist 10 in the wire region 31 may be made larger than the thickness of the solder resist 10 in the ground region 32, and the thickness of the solder resist 10 in the power region 30 may be made larger than the thickness of the solder resist 10 in the wire region 31.

In the semiconductor device 1 and the wiring board 90, the thicknesses of the solder resists 10 in the power region 30, the ground region 32 and the wire region 31 may be substantially equalized. In the semiconductor device 1 and the wiring board 90, the thickness of the solder resist 10 in the ground region 32 may be made larger than the thickness of the solder resist 10 in the power region 30, and the thicknesses of the solder resists 10 in the power region 30 and the wire region 31 may be substantially equalized. In the semiconductor device 1 and the wiring board 90, the thickness of the solder resist 10 in the power region 30 may be made larger than the thickness of the solder resist 10 in the wire region 31, and the thicknesses of the solder resists 10 in the wire region 31 and the ground region 32 may be substantially equalized. In the semiconductor device 1 and the wiring board 90, the thickness of the solder resist 10 in the power region 30 may be made larger than the thickness of the solder resist 10 in the ground region 32, and the thickness of the solder resist 10 in the ground region 32 may be made larger than the thickness of the solder resist 10 in the wire region 31. In the semiconductor device 1 and the wiring board 90, the thickness of the solder resist 10 in the ground region 32 may be made larger than the thickness of the solder resist 10 in the power region 30, and the thickness of the solder resist 10 in the power region 30 may be made larger than the thickness of the solder resist 10 in the wire region 31.

According to the embodiment, it is feasible to control the characteristic impedance of the signal wire and control capacitance of the decoupling capacitor.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device comprising:
   a board;
   a power wire formed on the board;
   a signal wire formed on the board;
   a ground wire formed on the board;
   an insulating layer covering the signal wire, the power wire and the ground wire; and
   a metal film covering the insulating layer,
   wherein
   the power wire is connected to a power potential,
   the ground wire is connected to a ground potential,
   the metal film is segmented into a plurality of segments,
   the metal film covering the insulating layer covering the power wire and the signal wire is connected to the ground potential, and
   the metal film covering the insulating layer covering the ground wire is connected to the power potential, the board is formed with a plurality of signal wires, the two neighboring signal wires are differential wires, and the metal film is not formed on the insulating layer covering the differential wires.

2. The semiconductor device according to claim 1, wherein the insulating layer is a solder resist.

3. The semiconductor device according to claim 1, further comprising:
   a semiconductor element located on the board and including a first bonding pad; and
   a first wire connected to the first bonding pad.

4. The semiconductor device according to claim 3, wherein the first wire is electrically connected to the signal wire.

5. The semiconductor device according to claim 4, further comprising a second bonding pad connected to the signal wire and the first wire.

6. The semiconductor device according to claim 3, wherein the first wire is electrically connected to the metal film.

7. The semiconductor device according to claim 6, further comprising a second bonding pad connected to the metal film and the first wire.

8. The semiconductor device according to claim 6, further comprising:
   a second bonding pad located between the metal film and the semiconductor element, the second bonding pad being connected to the first wire; and
   a second wire connected to the metal film and the second bonding pad.

9. The semiconductor device according to claim 3, wherein the semiconductor element is surrounded by the metal film in a plan view.

10. The semiconductor device according to claim 1, wherein a thickness of the insulating layer covering the power wire is different from a thickness of the insulating layer covering the signal wire.

11. The semiconductor device according to claim 1, wherein a thickness of the insulating layer covering the ground wire is different from a thickness of the insulating layer covering the signal wire.

12. A wiring board, on which a semiconductor device is provided, comprising:
   a power wire formed on the wiring board;
   a signal wire formed on the wiring board;
   a ground wire formed on the wiring board;
   an insulating layer covering the signal wire, the power wire and the ground wire; and
   a metal film covering the insulating layer,
   wherein
   the power wire is connected to a power potential,
   the ground wire is connected to a ground potential,
   the metal film is segmented into a plurality of segments,
   the metal film covering the insulating layer covering the power wire and the signal wire is connected to the ground potential, and
   the metal film covering the insulating layer covering the ground wire is connected to the power potential, the board is formed with a plurality of signal wires, the two neighboring signal wires are differential wires, and the metal film is not formed on the insulating layer covering the differential wires.

13. The wiring board according to claim 4, wherein the insulating layer is a solder resist.

14. The wiring board according to claim 12, wherein a thickness of the insulating layer covering the power wire is different from a thickness of the insulating layer covering the signal wire.

15. The wiring board according to claim 12, wherein a thickness of the insulating layer covering the ground wire is different from a thickness of the insulating layer covering the signal wire.

* * * * *